US012660528B2

(12) United States Patent
Nicholl et al.

(10) Patent No.: US 12,660,528 B2
(45) Date of Patent: Jun. 16, 2026

(54) METHODS FOR FABRICATING PROTECTED ELECTRODE ARRAYS WITH INITIAL INTERPOSER BONDING

(71) Applicant: Fabric8Labs, Inc., San Diego, CA (US)

(72) Inventors: Ryan Nicholl, San Diego, CA (US); David Pain, Oceanside, CA (US); Andrew Edmonds, Oceanside, CA (US); Kareemullah Shaik, San Diego, CA (US); Edward White, San Diego, CA (US)

(73) Assignee: Fabric8Labs, Inc., San Diego, CA (US)

( * ) Notice: Subject to any disclaimer, the term of this patent is extended or adjusted under 35 U.S.C. 154(b) by 479 days.

(21) Appl. No.: 18/468,554

(22) Filed: Sep. 15, 2023

(65) Prior Publication Data

US 2024/0304440 A1 Sep. 12, 2024

Related U.S. Application Data

(60) Provisional application No. 63/488,588, filed on Mar. 6, 2023.

(51) Int. Cl.
*H05K 3/44* (2006.01)
*H10P 14/20* (2026.01)
(Continued)

(52) U.S. Cl.
CPC ...... *H10P 14/6336* (2026.01); *H10P 14/3411* (2026.01); *H10P 50/283* (2026.01);
(Continued)

(58) Field of Classification Search
CPC .............. H10P 14/6336; H10P 14/3411; H10P 50/283; H10P 72/0418; H10P 72/0604;
(Continued)

(56) References Cited

U.S. PATENT DOCUMENTS 4,575,330 A 3/1986 Hull
4,678,282 A 7/1987 Yaniv et al.
(Continued)

FOREIGN PATENT DOCUMENTS

CN 104178782 A 12/2014
CN 204097583 U 1/2015
(Continued)

OTHER PUBLICATIONS

Frey et al., "Switch-matrix-based High-Density Microelectrode Array in CMOS Technology", IEEE Journal of Solid-State-Circuits, Feb. 2010, pp. 467-482, vol. 45, No. 2.
(Continued)

*Primary Examiner* — Samuel Park
(74) *Attorney, Agent, or Firm* — Polygon IP, LLP

(57) ABSTRACT

Described herein are protected electrode arrays and methods of fabricating thereof. Such electrode arrays can be used in electrochemical-additive manufacturing (ECAM) systems and other systems/applications. In some examples, a protected electrode array comprises an electrode-interface circuit and an interposer bonded to the circuit, e.g., using an adhesive layer. The interposer can include an interposer base formed from silicon, glass, and other like materials suitable for operating environments. The interposer base comprises vias, which are aligned with the circuit's electrode connectors, and interposer electrodes deposited within these vias and electrically coupled to the electrode connectors. In some examples, the interposer comprises a base cover and/or electrode covers positioned over the interposer base and the interposer electrodes, respectively. The interposer can be bonded to the electrode-interface circuit before forming the vias, after forming the vias but before depositing the interposer electrodes, or after depositing the interposer electrodes within the vias.

20 Claims, 11 Drawing Sheets

(51) Int. Cl.

| | |
|---|---|
| *H10P 14/60* | (2026.01) |
| *H10P 50/28* | (2026.01) |
| *H10P 72/00* | (2026.01) |
| *H10P 72/70* | (2026.01) |
| *H10W 70/05* | (2026.01) |
| *B33Y 10/00* | (2015.01) |

(52) U.S. Cl.
CPC ...... *H10P 72/0418* (2026.01); *H10P 72/0604* (2026.01); *H10P 72/74* (2026.01); *H10W 70/095* (2026.01); *B33Y 10/00* (2014.12)

(58) Field of Classification Search
CPC ... H10P 72/74; H10W 70/095; H10W 70/635; B33Y 10/00
See application file for complete search history.

(56) References Cited

U.S. PATENT DOCUMENTS

| | | | |
|---|---|---|---|
| 5,132,820 | A | 7/1992 | Someya et al. |
| 5,403,460 | A | 4/1995 | Sala et al. |
| 5,641,391 | A | 6/1997 | Hunter et al. |
| 5,998,805 | A | 12/1999 | Shi et al. |
| 6,036,834 | A | 3/2000 | Clerc |
| 7,839,831 | B2 | 11/2010 | Vrcelj et al. |
| 8,168,540 | B1 | 5/2012 | Reid et al. |
| 8,681,077 | B2 | 3/2014 | Kimura |
| 9,777,385 | B2 | 10/2017 | Wirth et al. |
| 10,465,307 | B2 | 11/2019 | Pain et al. |
| 10,724,146 | B1 | 7/2020 | Pain et al. |
| 10,914,000 | B1 | 2/2021 | Pain et al. |
| 10,947,632 | B1 | 3/2021 | Pain et al. |
| 11,232,956 | B2 | 1/2022 | Pain et al. |
| 11,313,035 | B2 | 4/2022 | Pain et al. |
| 11,313,036 | B2 | 4/2022 | Pain et al. |
| 11,401,603 | B2 | 8/2022 | Pain et al. |
| 2001/0014409 | A1 | 8/2001 | Cohen |
| 2003/0006133 | A1 | 1/2003 | Metzger |
| 2003/0045085 | A1* | 3/2003 | Taniguchi ........... H10W 70/635 |
| | | | 257/E21.597 |
| 2004/0129573 | A1 | 7/2004 | Cohen |
| 2005/0045252 | A1 | 3/2005 | Yamasaki et al. |
| 2005/0176238 | A1 | 8/2005 | Cohen et al. |
| 2005/0183959 | A1 | 8/2005 | Wilson et al. |
| 2005/0202660 | A1 | 9/2005 | Cohen et al. |
| 2005/0223543 | A1 | 10/2005 | Cohen et al. |
| 2006/0283539 | A1 | 12/2006 | Slafer |
| 2007/0068819 | A1 | 3/2007 | Singh et al. |
| 2007/0089993 | A1 | 4/2007 | Schwartz et al. |
| 2007/0158832 | A1* | 7/2007 | Takaike .............. H10W 70/093 |
| | | | 257/734 |
| 2007/0221504 | A1 | 9/2007 | Luo |
| 2010/0300886 | A1 | 12/2010 | Lin et al. |
| 2011/0210005 | A1 | 9/2011 | Bossche et al. |
| 2015/0232984 | A1* | 8/2015 | Yamamoto ........... C23C 16/045 |
| | | | 216/12 |
| 2017/0145584 | A1 | 5/2017 | Wirth et al. |
| 2019/0160594 | A1 | 5/2019 | Flamm et al. |
| 2021/0047744 | A1 | 2/2021 | Biton |
| 2022/0081760 | A1 | 3/2022 | Pain et al. |
| 2024/0120259 | A1* | 4/2024 | Takeuchi ........... H10W 20/023 |

FOREIGN PATENT DOCUMENTS

| | | | |
|---|---|---|---|
| CN | 104593830 A | | 5/2015 |
| JP | 2004327606 A | * | 11/2004 |
| WO | 2017087884 A1 | | 5/2017 |
| WO | 2019150362 A1 | | 8/2019 |
| WO | 2021041265 A1 | | 3/2021 |

OTHER PUBLICATIONS

International Search Report and Written Opinion for PCT/US2020/047531 dated Sep. 29, 2020.
Jiang, Hongrui et al., "Fabrication of thick silicon dioxide sacrificial and isolation blocks in a silicon substrate", J. Micromech. Microeng. 12 (2002) 87-95.
Muller, Jan et al., "High-resolution CMOS MEA platform to study neurons at subcellular, cellular, and network levels", Lab Chip, 2015, 15, 2767.
Nakamura et al., Incorporation of input function into displays using LTPS TFT technology, Journal of the SID, 2006, pp. 363-369, 14/4.
Stewart et al., "Polysilicon TFT Technology for Active Matrix OLEO Displays", IEEE Transactions on Electron Devices, May 2001, pp. 845-851, vol. 48, No. 5.
Supplementary International Search Report for PCT/US2020/047531 dated Nov. 22, 2021.
U.S. Appl. No. 17/535,437, filed Nov. 24, 2021.
U.S. Appl. No. 17/566,546, filed Dec. 30, 2021.
Zhao et al., "Size-dependent mechanical behavior of nanoscale polymer particles through coarse-grained molecular dynamics simulation", Nanoscale Research Letters 2013, 8:541.

* cited by examiner

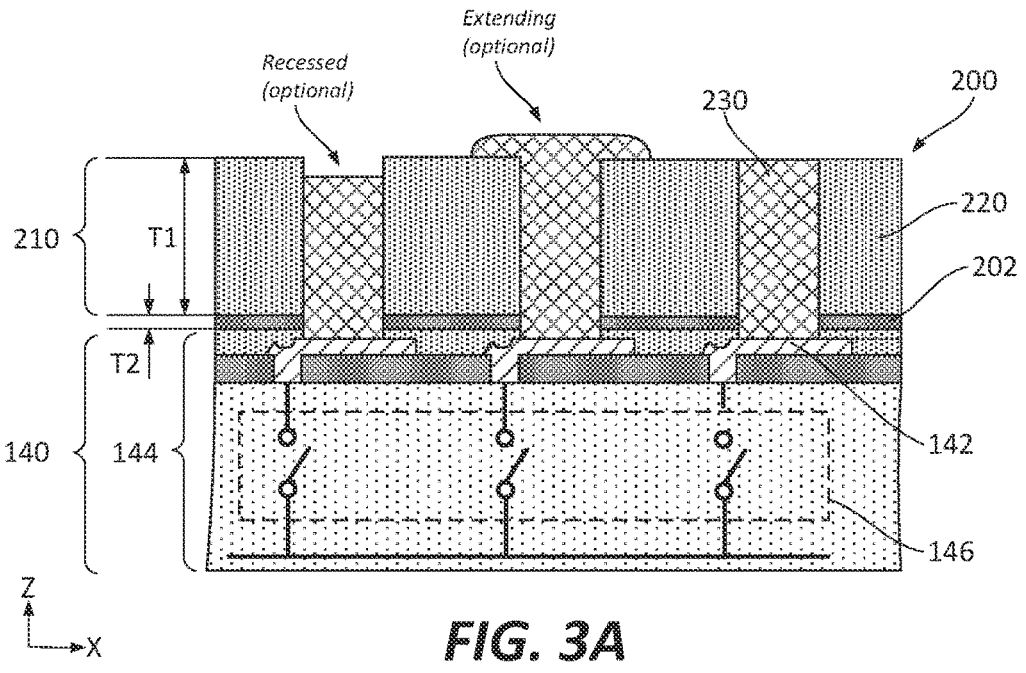
*FIG. 3A*
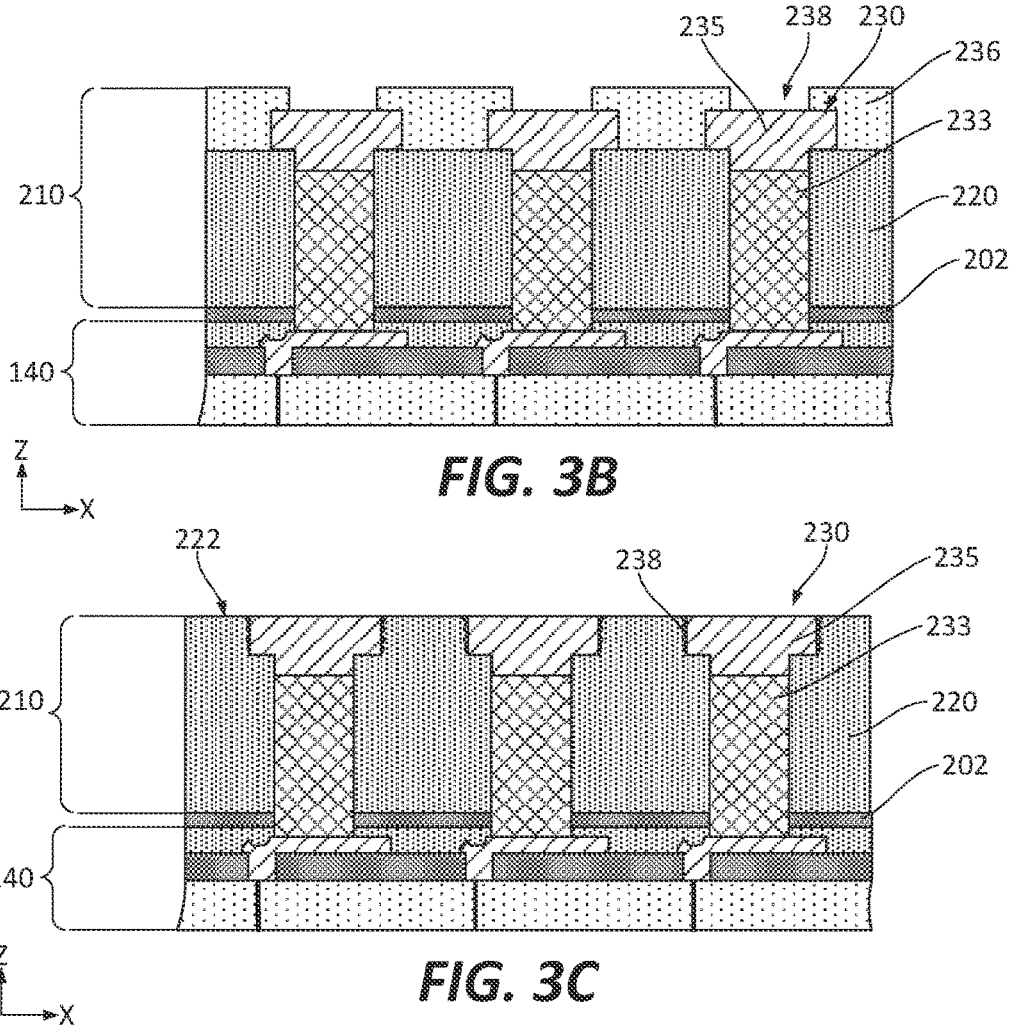
*FIG. 3B*
*FIG. 3C*

600

Form vias 420

Form thermal oxide 425

Bond 410

Apply Adhesive Layer 440

Pattern Adhesive Layer 445

Pattern Adhesive Layer 445

Remove excessive interposer base 427

Deposit interposer electrodes 430 (metallization)

Form seed layer 431

Form Plug 432

Remove Portion of Seed Layer 434

Remove Plug 435

Electroplate interposer electrodes 436

Polish surface of interposer base 438

220

220   225

228   225
220

202
144

142   140

202
144

142

228   230
220
202
144

142

240   225
220

240   245
220

245   222
240
220

225   222
240
220

230
220

228   230
220

220
202
144

200

142

228   230   *Bond*
220
202
144

228   230   *Pattern Adhesive*
220
202
144

142

200

144

220

Y
X

METHODS FOR FABRICATING PROTECTED ELECTRODE ARRAYS WITH INITIAL INTERPOSER BONDING

CROSS-REFERENCE TO RELATED APPLICATIONS

This application claims the benefit under 35 U.S.C. § 119 (e) of U.S. Provisional Patent Application No. 63/488, 588, filed on 2023 Mar. 6, which is incorporated herein by reference in its entirety for all purposes.

BACKGROUND

Additive manufacturing, also known as 3-dimensional (3D) printing, is often used to produce complex parts using a layer-by-layer deposition process on substrates. Additive manufacturing can utilize a variety of processes in which various materials (e.g., plastics, liquids, and/or powders) are deposited, joined, and/or solidified. Some examples of techniques used for additive manufacturing include vat photopolymerization, material jetting, binder jetting, powder bed fusion (e.g., using selective laser melting or electron beam melting), material extrusion, directed energy deposition, and sheet lamination. However, metal additive manufacturing has been limited due to the high cost associated with selective laser melting and electron beam melting systems. Furthermore, thermal fusing produces parts with rough surface finishes because the unmelted metal powder is often sintered to the outer edges of the finished product. Electrochemical-additive manufacturing (ECAM) provides many new options not available with conventional additive manufacturing techniques.

SUMMARY

Described herein are protected electrode arrays and methods of fabricating thereof. Such electrode arrays can be used in electrochemical-additive manufacturing (ECAM) systems and other systems/applications. In some examples, a protected electrode array comprises an electrode-interface circuit and an interposer bonded to the circuit, e.g., using an adhesive layer. The interposer can include an interposer base formed from silicon, glass, and other such materials suitable for operating environments. The interposer base comprises vias, which are aligned with the circuit's electrode connectors, and interposer electrodes deposited within these vias and electrically coupled to the electrode connectors. In some examples, the interposer comprises a base cover and/or electrode covers positioned over the interposer base and the interposer electrodes, respectively. The interposer can be bonded to the electrode-interface circuit before forming the vias, after forming the vias but before depositing the interposer electrodes, or after depositing the interposer electrodes within the vias.

Clause 1. A method of fabricating a protected electrode array assembly, the method comprising: forming a passivation layer on an interposer base; bonding the interposer base to an electrode interface circuit using an adhesive layer, wherein: the electrode interface circuit comprises a circuit base and electrode connectors supported within the circuit base, and the adhesive layer is positioned between the circuit base and the interposer base; after bonding the interposer base, forming vias in the interposer base using a technique comprising: a plasma etch step of directing plasma to the interposer base thereby creating a trench comprising a bottom and side walls, a deposition step of depositing a chemically inert passivation layer on the side walls and the bottom of the trench, and repeating the plasma etch step and the deposition step until the vias are formed; and after forming the vias, depositing interposer electrodes at least partially within the vias in the interposer base thereby forming the interposer, which is a part of the protected electrode array assembly, wherein each of the electrode connectors is electrically coupled and mechanically attached to the interposer electrodes after depositing the interposer electrodes.

Clause 2. The method of clause 1, wherein the passivation layer is formed using thermal oxidation of the interposer base.

Clause 3. The method of clause 1, wherein: the interposer base comprises a primary surface and a secondary surface, opposite to the primary surface, and the passivation layer is formed on at least a secondary surface.

Clause 4. The method of clause 3, wherein the passivation layer is also formed on a primary surface, opposite of the secondary surface.

Clause 5. The method of clause 4, further comprising, prior to forming the vias in the interposer base, removing the passivation layer from the primary surface.

Clause 6. The method of clause 5, wherein the passivation layer on the secondary surface is retained after removing the passivation layer from the primary surface.

Clause 7. The method of clause 5, further comprising, after removing the passivation layer from the primary surface, depositing a second passivation layer on the primary surface using plasma-enhanced chemical vapor deposition (PECVD).

Clause 8. The method of clause 1, wherein, after forming the vias in the interposer base, the vias extend to but not through the adhesive layer.

Clause 9. The method of clause 8, further comprising, after forming the vias in the interposer base, removing portions of the adhesive layer exposed in the vias thereby exposing the electrode connectors of the electrode interface circuit within the vias.

Clause 10. The method of clause 1, wherein removing the portions of the adhesive layer exposed in the vias comprises one of (a) etching the portions of the adhesive layer and (b) dissolving the portions of the adhesive layer.

Clause 11. The method of clause 1, further comprising, after forming the vias in the interposer base, forming a third passivation layer at least on sidewalls of the vias using plasma-enhanced chemical vapor deposition (PECVD), and etching portions of the third passivation layer at bottoms of the vias thereby exposing the electrode connectors of the electrode interface circuit within the vias.

Clause 12. The method of clause 1, wherein: the plasma in the plasma etch step is formed using sulfur hexafluoride (SF6), and the chemically inert passivation layer comprises a fluorocarbon.

Clause 13. The method of clause 1, wherein the interposer base comprises one or more materials selected from the group consisting of silicon, glass, sapphire, silicon nitride, silicon dioxide, silicon oxynitride, and aluminum oxide.

Clause 14. The method of clause 1, wherein the interposer base comprises glass.

Clause 15. The method of clause 1, wherein the interposer base comprises silicon.

Clause 16. The method of clause 1, wherein depositing the interposer electrodes comprises:

sputtering a seed layer at least partially extending into the vias and over a surface of the interposer base, and electroplating the interposer electrodes into the vias.

Clause 17. The method of clause 16, wherein depositing the interposer electrodes further comprises polishing off the surface of the interposer base thereby removing a portion of the interposer electrodes extending over the surface of the interposer base.

Clause 18. The method of clause 16, wherein depositing the interposer electrodes comprises: prior to electroplating the interposer electrodes into the vias, filing the vias with temporary plugs, removing a portion of the seed layer extending over the surface of the interposer base, and removing the temporary plugs from the vias.

Clause 19. The method of clause 1, further comprising depositing a base cover, wherein: the base cover comprises electrode openings, exposing a portion of the interposer electrodes, and the interposer base is positioned between the base cover and electrode interface circuit.

Clause 20. The method of clause 1, further comprising, prior to depositing the interposer electrodes, removing a portion of the interposer base.

Clause 21. A method of fabricating a protected electrode array assembly, the method comprising: forming vias in an interposer base using a technique comprising: a plasma etch step of directing plasma to a surface of the interposer base thereby creating a trench comprising a bottom and side walls, a deposition step of depositing a chemically inert passivation layer on the side walls and the bottom of the trench, and repeating the plasma etch step and the deposition step until the vias are formed through the interposer base; depositing interposer electrodes at least partially within the vias in the interposer base thereby forming the protected electrode array assembly comprising the interposer base and the interposer electrodes protruding between a primary surface and a secondary surface, opposite the primary surface, of the interposer base and supported by the interposer base; and after depositing the interposer electrodes, bonding the interposer to an electrode interface circuit, wherein: the electrode interface circuit comprises a circuit base and electrode connectors supported within the circuit base, each of the electrode connectors is electrically coupled and mechanically attached to the interposer electrodes after bonding the interposer base to the electrode interface circuit, and the interposer base is attached to the circuit base.

Clause 22. The method of clause 21, wherein: the plasma in the plasma etch step is formed using sulfur hexafluoride (SF6), and the chemically inert passivation layer comprises a fluorocarbon.

Clause 23. The method of clause 21, wherein the interposer base comprises one or more materials selected from the group consisting of silicon, glass, sapphire, silicon nitride, silicon dioxide, silicon oxynitride, and aluminum oxide.

Clause 24. The method of clause 21, wherein the interposer base comprises silicon.

Clause 25. The method of clause 21, wherein depositing the interposer electrodes comprises: forming a seed layer at least partially extending into the vias and over a surface of the interposer base, electroplating the interposer electrodes into the vias, and polishing off the surface of the interposer base thereby removing a portion of the interposer electrodes extending over the surface of the interposer base.

Clause 26. The method of clause 25, wherein depositing the interposer electrodes comprises: prior to electroplating the interposer electrodes into the vias, filing the vias with temporary plugs, removing a portion of the seed layer extending over the surface of the interposer base, and removing the temporary plugs from the vias.

Clause 27. The method of clause 21, wherein bonding the interposer to the electrode interface circuit comprises: flowing an adhesive material between the circuit base and interposer base and curing the adhesive material thereby forming an adhesive layer positioned between the circuit base and interposer base.

Clause 28. The method of clause 21, wherein: bonding the interposer to the electrode interface circuit comprises: forming a stack comprising an adhesive layer such that the adhesive layer is positioned between the interposer to the electrode interface circuit and extending over the electrode connectors, and compressing the adhesive layer, compression between interposer electrodes and the electrode connectors is greater than between the interposer base and the circuit base, a first portion of the adhesive layer, extending between the electrode connectors and the interposer electrodes, becomes electrically conductive after compressing the adhesive layer, and a second portion of the adhesive layer, extending between the circuit base and the interposer base remains electrically nonconductive after compressing the adhesive layer.

Clause 29. The method of clause 21, further comprising forming a base cover, wherein: the base cover comprises electrode openings, exposing a portion of the interposer electrodes, and the interposer base is positioned between the base cover and electrode interface circuit.

Clause 30. The method of clause 21, further comprising, prior to depositing the interposer electrodes, forming a passivation layer on the interposer base using thermal oxidation of the interposer base comprising the vias.

Clause 31. A method of fabricating a protected electrode array assembly, the method comprising: forming vias in an interposer base using a technique comprising: a plasma etch step of directing plasma to a surface of the interposer base thereby creating a trench comprising a bottom and side walls, a deposition step of depositing a chemically inert passivation layer on the side walls and the bottom of the trench, and repeating the plasma etch step and the deposition step until the vias are formed through the interposer base; after forming the vias, bonding the interposer base to an electrode interface circuit using an adhesive layer, wherein: the electrode interface circuit comprises a circuit base and electrode connectors supported within the circuit base, and the adhesive layer is positioned between the circuit base and interposer base; and after bonding the interposer base, depositing interposer electrodes at least partially within the vias in the interposer base thereby forming the protected electrode array assembly, wherein: the interposer comprises the interposer base and the interposer electrodes such that each of the electrode connectors is electrically coupled and mechanically attached to the interposer electrodes after bonding the interposer base to the electrode interface circuit.

Clause 32. The method of clause 31, further comprising, after forming the vias and before bonding the interposer base, forming a passivation layer on the interposer base using thermal oxidation of the interposer base comprising the vias.

Clause 33. The method of clause 31, wherein bonding the interposer base to the electrode interface circuit comprises: applying the adhesive layer to the interposer base and patterning the adhesive layer such that the vias are open at both ends.

Clause 34. The method of clause 31, wherein depositing the interposer electrodes comprises: forming a seed layer at least partially extending into the vias and over a surface of the interposer base, electroplating the interposer electrodes into the vias, and polishing off the surface of the interposer base thereby removing a portion of the interposer electrodes extending over the surface of the interposer base.

Clause 35. The method of clause 34, wherein depositing the interposer electrodes further comprises: prior to electroplating the interposer electrodes into the vias, filing the vias with temporary plugs, removing a portion of the seed layer extending over the surface of the interposer base, and removing the temporary plugs from the vias.

Clause 36. The method of clause 31, wherein: the plasma in the plasma etch step is formed using sulfur hexafluoride (SF6), and the chemically inert passivation layer comprises a fluorocarbon.

Clause 37. The method of clause 31, wherein the interposer base comprises one or more materials selected from the group consisting of silicon, glass, sapphire, silicon nitride, silicon dioxide, silicon oxynitride, and aluminum oxide.

Clause 38. The method of clause 31, wherein the interposer base comprises silicon.

Clause 39. The method of clause 31, further comprising forming a base cover, wherein: the base cover comprises electrode openings, exposing a portion of the interposer electrodes, and the interposer base is positioned between the base cover and electrode interface circuit.

Clause 40. The method of clause 31, further comprising, prior to depositing the interposer electrodes, removing a portion of the interposer base.

Clause 41. A protected electrode array assembly comprising: an electrode interface circuit comprising a circuit base, deposition control circuits supported by the circuit base, and electrode connectors supported by the circuit base, wherein each of the deposition control circuits is configured to controllably connect a corresponding one of the electrode connectors to a power supply; an interposer comprising an interposer base and interposer electrodes, wherein the interposer electrodes electrically connected and mechanically attached to the electrode connectors of the electrode interface circuit, wherein: a surface of the interposer electrodes is exposed, and at least the deposition control circuits and the electrode connectors are isolated from environment at least in part by the interposer; and an adhesive layer, positioned at least between the circuit base and the interposer base and mechanically supporting the interposer on the electrode interface circuit.

Clause 42. The protected electrode array assembly of clause 41, wherein each of the interposer electrodes comprises an interposer conductor and an electrode cover such that the interposer conductor is positioned between the electrode cover and a corresponding one of the electrode connectors.

Clause 43. The protected electrode array assembly of clause 42, wherein the electrode cover comprises an anchoring edge interlocked within the interposer base.

Clause 44. The protected electrode array assembly of clause 42, wherein: the electrode cover has a first side and a second side, opposite of the first side and facing the corresponding one of the electrode connectors, and the second side is wider than the first side.

Clause 45. The protected electrode array assembly of clause 42, wherein: the electrode cover comprises platinum, and the interposer conductor comprises polysilicon.

Clause 46. The protected electrode array assembly of clause 41, wherein a first interface formed by the interposer electrodes and the electrode connectors is offset relative to a second interface formed by the circuit base and the adhesive layer.

Clause 47. The protected electrode array assembly of clause 41, wherein the interposer electrodes protrude above the interposer base and forms a cap over a surface of the interposer base facing away from the electrode interface circuit.

Clause 48. The protected electrode array assembly of clause 41, wherein the interposer electrodes have a uniform composition throughout an entire volume of the interposer electrodes.

Clause 49. The protected electrode array assembly of clause 41, wherein: the adhesive layer is an anisotropic adhesive layer further extending between the electrode connectors and the interposer electrodes, a first portion of the adhesive layer, extending between the electrode connectors and the interposer electrodes, is electrically conductive, and a second portion of the adhesive layer, extending between the circuit base and the interposer base is electrically non-conductive.

Clause 50. The protected electrode array assembly of clause 41, wherein: the electrode interface circuit further comprises deposition control circuits such that each of the deposition control circuits controls a current flow through a corresponding one of the electrode connectors, and deposition control circuits are transistors.

BRIEF DESCRIPTION OF THE DRAWINGS

FIG. 3A is a schematic cross-sectional view of a protected electrode array assembly illustrating different examples of interposer electrodes, in accordance with some examples.

FIG. 3B is a schematic cross-sectional view of a protected electrode array assembly comprising a base cover positioned over interposer electrodes, in accordance with some examples.

FIG. 3C is a schematic cross-sectional view of a protected electrode array assembly, in which the interposer electrodes comprise interposer conductors and electrode covers, in accordance with some examples.

DETAILED DESCRIPTION

Figure 1A:
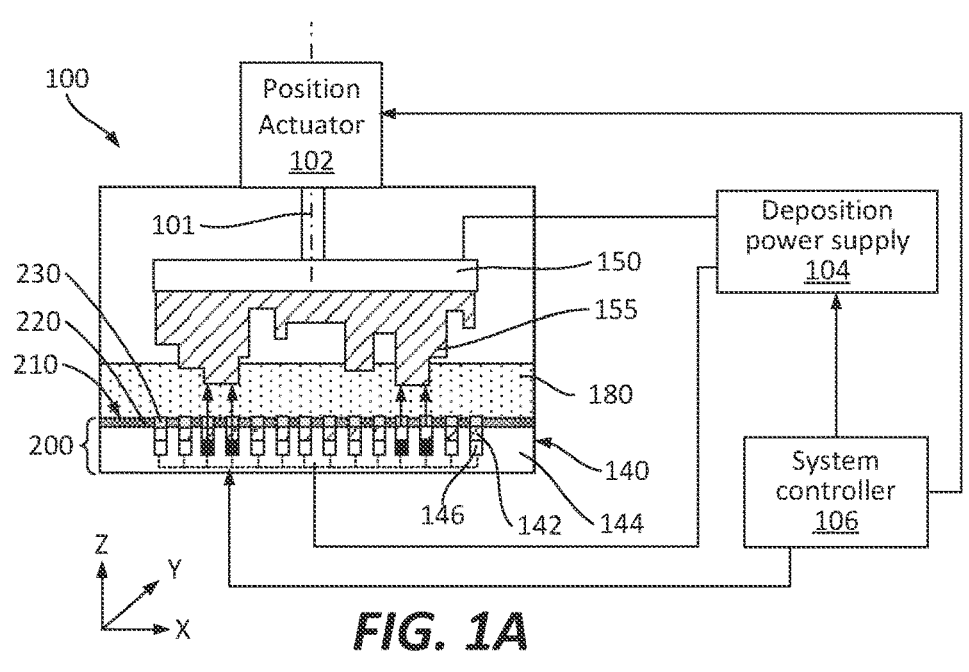
FIG. 1A is a schematic illustration of an ECAM system comprising a protected electrode array assembly, operable as a printhead in the ECAM system, in accordance with some examples.

In the following description, numerous specific details are outlined to provide a thorough understanding of the presented concepts. The presented concepts may be practiced without some or all of these specific details. In other instances, well-known process operations have not been described in detail to not unnecessarily obscure the described concepts. While some concepts will be described in conjunction with the specific embodiments, it will be understood that these embodiments are not intended to be limiting.

Introduction

ECAM systems use electrolytic solutions/electrolytes to form parts having various shapes, compositions, and other characteristics. An example ECAM system comprises two electrodes, one of which is arranged into an electrode array to provide more granular control over deposition conditions. Specifically, the electrode array is formed by individually-addressable electrodes, which can be arranged as a two-dimensional (2D) grid, and which can be also referred to as electrode pixels or pixelated electrodes. When these individually-addressable electrodes are used as positive electrodes for supplying positive electrical charge to and receiving electrons from the electrolyte, these electrodes can be referred to as pixelated anodes. The electrode array may be also referred to as a printhead, providing a reference to 3D printing aspects of ECAM systems. Furthermore, display terminology can be used to refer to individually-addressable electrodes as "pixels". An instantaneous activation pattern produced by the array (by controllably activating a subset of pixels) may be referred to as an "image". Another electrode of an ECAM system can be referred to as a deposition electrode or, more specifically, an electrolytic-deposit-receiving electrode. This electrode is configured to receive electrolytically deposited material during system operation.

The operation of electrode connectors or, more generally, interposer electrodes can be controlled using deposition control circuits, e.g., thin-film transistors (silicon-based thin-film transistors, indium-gallium-zinc oxide-based transistors, etc.) in which case, the array can be referred to as a thin-film transistor (TFT) array or a TFT micro-electrode array. These individually-addressable electrodes and corresponding deposition control circuits can be arranged in various patterns, e.g., 2-D rectangular, 2-D hexagonal, and other like patterns. Furthermore, these individually-addressable electrodes may be of uniform or non-uniform size, shape, thickness, composition, and other characteristics.

Specifically, the current density distribution is a critical parameter of the ECAM process. The current density distribution is influenced by the electrolyte conductivity, electrode shapes/positions relative to each other, electrode surface properties (e.g., the presence and properties of surface-active molecules), and potentials applied (which is one of the distinguishing features of the ECAM systems), among other factors. One advantage of using electrode arrays is controlling the current density distribution at each individually-addressable electrode. When an electrolytic-deposit-receiving electrode is positioned sufficiently close to an electrode array, this current density distribution at each individually-addressable electrode is translated into the corresponding current density distribution on the portions of the deposition electrode aligned with the corresponding individually-addressable electrodes. This corresponding current density distribution can be used for controlling plating rates, grain structures, grain sizes, and deposits' compositions among other characteristics. Overall, this current density control can be used to fabricate 3D parts ("prints") by successive controlled deposition of layers based on the desired properties of the product.

The electrode array and the electrolytic-deposit-receiving electrode are often positioned close together, e.g., less than 100 micrometers from each other, forming a gap. This arrangement helps to control the selective deposition aspects provided by each individually-addressable electrode. Specifically, each individually-addressable electrode is aligned with a specific portion of the deposition electrode surface or, even more specifically, with a specific portion of the deposited material surface. For purposes of this disclosure, the terms "deposited material" and "deposition electrode" are often used interchangeably since the deposition is performed on the deposited material surface using the electric current passing through both the deposition electrode and the deposited material. The deposited material effectively becomes part of the deposition electrode/cathode during the deposition operation. It should be noted that controlling the operation of this individually-addressable electrode effectively controls the deposition on the corresponding surface portion, aligned with the individually-addressable electrode.

In some application examples, electrode arrays can operate in various electrolyte environments, some of which can be damaging to these arrays. For example, electrode arrays and deposition control circuits, positioned under these arrays can corrode after prolonged operations in such electrolyte environments. Furthermore, various substrates used for supporting these electrodes and circuits can be damaged. This damage and the overall degradation can be further exacerbated by electric currents flowing through electrodes during their operation.

Described herein are methods and systems for protecting such electrode arrays (including individual electrodes, deposition control circuits, and supporting substrates). In some cases, an interposer can be attached/bonded to an electrode-interface circuit, such as an electrode array, which collectively forms a protected electrode array assembly (aka a printhead). The interposer can be made from one or more materials that are resistant to the operating environment (e.g., electrolyte compositions and operation potentials). For example, the interposer can include an interposer base formed from silicon, glass, and other materials. The interposer base can comprise multiple vias (holes) aligned with the individual electrode connectors of the electrode-interface circuit. Interposer electrodes are deposited within these vias in the interposer base, extending to and electrically coupled to the electrode connectors. The interposer can be bonded to the electrode-interface circuit before forming the vias, after forming the but before depositing the interposer electrodes, or after depositing the interposer electrodes within the vias. However, one challenge with this order of operations is handling very thin wafers (e.g., a silicon wafer used as an interposer base). For example, such wafers can be less than 100-micrometer thick and 150 millimeters in diameter. One approach involves temporarily bonding the substrate to a substrate-carrier wafer. Additional aspects are described below.

In some examples, an interposer base may be bonded to an electrode interface circuit first such that the via is created in the interposer base thereafter (after the bonding operation). In these examples, the initial thickness of the interposer base (at the time of bonding) may be greater than the final thickness (when the protected electrode array assembly is completed). For example, an interposer base may be too fragile at its final thickness to be handled as a standalone component. However, once bonded to the electrode interface circuit, the interposer base has additional mechanical support (from the electrode interface circuit), allowing the safe use of subtractive processes like grinding, milling, lapping, and the like.

However, forming vias (in the interposer base) after bonding the interposer base to the electrode interface circuit using an adhesive layer can cause some deterioration of the adhesive layer (e.g., by the etchant used to form the vias), which can create uninsulated paths between adjacent electrodes. This potential problem can be addressed, for example, by passivating the surface of the interposer base that contacts the adhesive layer (e.g., using a thermal oxidation process).

Some example process modifiers: (a) thermal oxidation—low risk to add to all interposers prior to bonding; (b) grinding/chemical mechanical polishing (CMP)—can be used to thin the interposer base; (c) plasma enhanced chemical vapor deposition (PECVD) passivation—may be required at multiple steps; (d) thick oxide—a combination of silicon etching and oxidation to achieve silicon dioxide ($SIO_2$) layer on the interposer base (silicon dry/wet etched away); (e) side wall metallization—sputtering, atomic layer deposition (ALD) to allow through silicon vias (TSV) plating seed.

Some examples of bonding include, but are not limited to (a) adhesive bonding via benzo-cyclobutene (BCB), polyimide (PI), epoxy-based photoresists such as SU-8, PerminNex®, etc.—may require high temperature and chemical resistance; (b) bump bonding—may require additional processing steps, high risk; (c) eutectic—for specific material compatibilities; (d) Au—Au thermo-compression—possibly additional processing steps, generally high alignment/resolution requirement, may introduce the risk of shorting; (e) anodic materials/compatibility and high flatness; (f) silicon fusion—may require high temperature; and (g) glass frit—may require high temperature, may be hard to pattern.

ECAM System Examples

Protected electrode array assemblies can be used, as printheads, for various applications and systems, e.g., ECAM system 100. FIG. 1A is a schematic illustration of ECAM system 100 used for depositing or, more specifically, electroplating material 155, in accordance with some examples. ECAM system 100 may comprise a position actuator 102, a system controller 106, a deposition power supply 104, a protected electrode array assembly 200, and a deposition electrode 150. In some examples, deposition electrode 150 is connected to deposition power supply 104 and controllably supported relative to the protected electrode array assembly 200 (e.g., by position actuator 102). Protected electrode array assembly 200 comprises electrode-interface circuit 140 and interposer 210 and can be also referred to as a "printhead" due to the deposition (e.g., electrochemical deposition) caused by protected electrode array assembly 200 during the operation of ECAM 100 system.

Electrode-interface circuit 140 comprises circuit base 144 and electrode connectors 142 supported by circuit base 144. Interposer 210 comprises interposer base 220 and interposer electrodes 230. Interposer electrodes 230 are electrically connected to and, in some examples, directly interface electrode connectors 142 of the electrode interface circuit 140. Interposer 210 separates electrode-interface circuit 140 from electrolyte solution 180 thereby protecting various components of electrode-interface circuit 140 from deterioration.

Electrode-interface circuit 140 also comprises deposition control circuits 146 such that each deposition control circuit 146 controls the current flow through a corresponding one of electrode connectors 142 (e.g., based on input from the system controller 106) and eventually through the corresponding interposer electrodes 230 as well the corresponding portion of the electrolyte solution 180 thereby causing the deposition on the corresponding surface of material 155 on deposition electrode 150.

Position actuator 102 can be mechanically coupled to electrode-interface circuit 140 and/or deposition electrode 150 and used to change the relative position of electrode-interface circuit 140 and deposition electrode 150 (e.g., changing the gap between electrode-interface circuit 140 and deposition electrode 150, linearly moving and/or rotating one or both electrode-interface circuit 140 and deposition electrode 150 within a plane parallel to the electrode-interface circuit 140). While FIG. 1A illustrates position actuator 102 being coupled to deposition electrode 150, other examples are also within the scope.

System controller 106 is used for controlling the operations of various components. For example, FIG. 1A illustrates system controller 106 being communicatively coupled with position actuator 102, deposition power supply 104, and deposition control circuits 146. For example, the system controller 106 can instruct position actuator 102 to change the relative position of electrode-interface circuit 140 and deposition electrode 150. In the same or other examples, the system controller 106 can selectively instruct some deposition control circuits 146 to provide current through corresponding electrode connectors 142.

During the operation of ECAM system 100, system 100 also comprises electrolyte solution 180 comprising a source of cations (e.g., metal cations) that are reduced on deposition electrode 150 (operable as a cathode during this operation) and form a material 155. More specifically, material 155 is deposited onto deposition electrode 150 from electrolyte solution 180 by flowing the electrical current between selected ones of electrode connectors 142 and deposition electrode 150 as noted above. In some examples, further granularity is provided by controlling the current levels through each electrode connector 142. In other words, not only the current can be shut off through one or more electrode connectors 142 but different levels of current can flow through different electrode connectors 142.

Figure 1B:
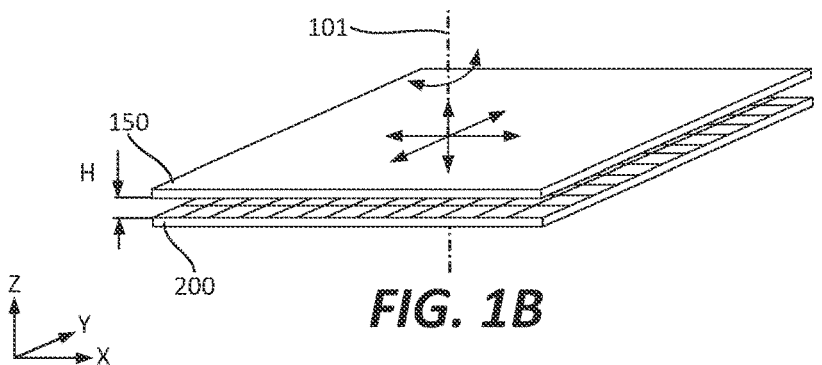
FIG. 1B is a schematic illustration of an electrochemical cell of the ECAM system, the cell comprising a protected electrode array assembly, operable as a printhead, and a deposition electrode, in accordance with some examples.

FIG. 1B is a perspective schematic view of a protected electrode array assembly 200 and deposition electrode 150, in accordance with some examples. This combination of protected electrode array assembly 200 and deposition electrode 150 may be also referred to as an electrodeposition cell, which is a primary component of ECAM system 100. Deposition electrode 150 and protected electrode array assembly 200 form a gap, which is filled (partially or fully) with an electrolyte solution during the operation. The height (H) of this gap is specifically controlled (e.g., between 5 micrometers and 200 micrometers) as the height influences the deposition conditions. For example, an excessive gap height can result in lower deposition rates and less control over the deposition locations. On the other hand, a gap height below the target value can cause excessive deposition rates and even shorts. It should be noted that the height gap can be different at different portions of deposition electrode 150 and protected electrode array assembly 200. Furthermore, the average gap height can change between various deposition and electrolyte flow stages (e.g., using position actuator 102). For example, the average gap height can be increased to decrease the average current flow between deposition electrode 150 and protected electrode array assembly 200 (and vice versa). Furthermore, the gap can be increased (while the deposition is suspended) to flow fresh electrolyte solution into the gap. Overall, deposition electrode 150 and protected electrode array assembly 200 can be moved relative to each in various directions as indicated in FIG. 1B, e.g., along primary axis 101 and/or within the plane perpendicular to primary axis 101 (including the rotation about primary axis 101).

Figure 1C:
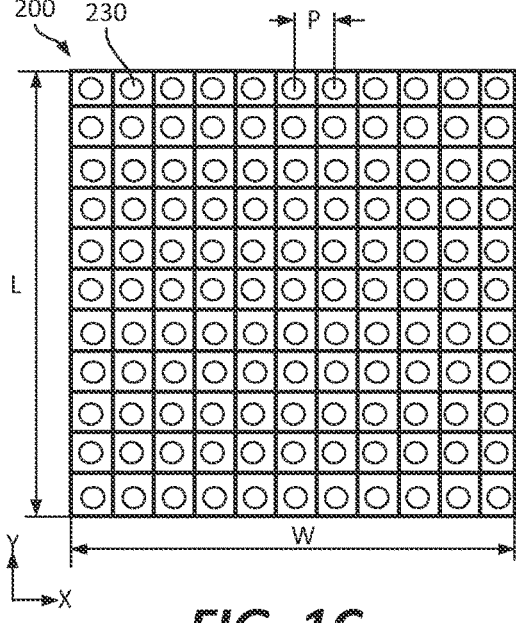
FIG. 1C is a schematic illustration of a protected electrode array assembly showing a grid/array formed by interposer electrodes, in accordance with some examples.

Referring to FIG. 1C, protected electrode array assembly 200 comprises interposer electrodes 230, which may be also referred to as grid regions, microelectrodes (or micro-anodes), and/or pixels. More specifically, ECAM system 100 provides electrical control of each interposer electrode 230 (using separate deposition control circuits 146). This individually-addressable feature of these interposer electrodes 230 allows the achievement of different deposition rates at different locations on deposition electrode 150. Interposer electrodes 230 form a deposition grid, in which these portions may be offset relative to each other along the X-axis and Y-axis. The grid may be characterized by a grid X-axis resolution (corresponding to the number of grid regions along the X-axis), grid Y-axis resolution (corresponding to the number of grid regions along the Y-axis), grid X-axis pitch (corresponding to the length of each grid region along the X-axis), grid Y-axis pitch (corresponding to the length of a grid region along the Y-axis), overall grid pitch (corresponding to the minimum of the grid X-axis pitch and the grid Y-axis pitch), and grid region area. In some examples, one or both of the grid's X-axis resolution and the Y-axis resolution is between 50 and 500, such as between 75 and 250. In the same or other examples, one or both of the grid's X-axis pitch and the Y-axis pitch are 100 micrometers or less, 50 micrometers or less, or even 35 micrometers or less. Other example grids include triangular, hexagonal, or other patterns that partially or completely tessellate a surface. In some examples, interposer electrodes 230 are formed/deposited from an insoluble conductive material, such as platinum group metals and their associated oxides, doped semiconducting materials, and carbon nanotubes. The shape of interposer electrodes 230 can be round, rectangular, or other shapes. The size of interposer electrodes 230 (the pixel size) is slightly smaller (e.g., at least 10% smaller, at least 20% smaller) than the pitch thereby providing the space between interposer electrodes 230. In one example, the pitch is between 25 micrometers and 35 micrometers, while the pixel size can be between 15 micrometers and 20 micrometers.

Figure 2A:
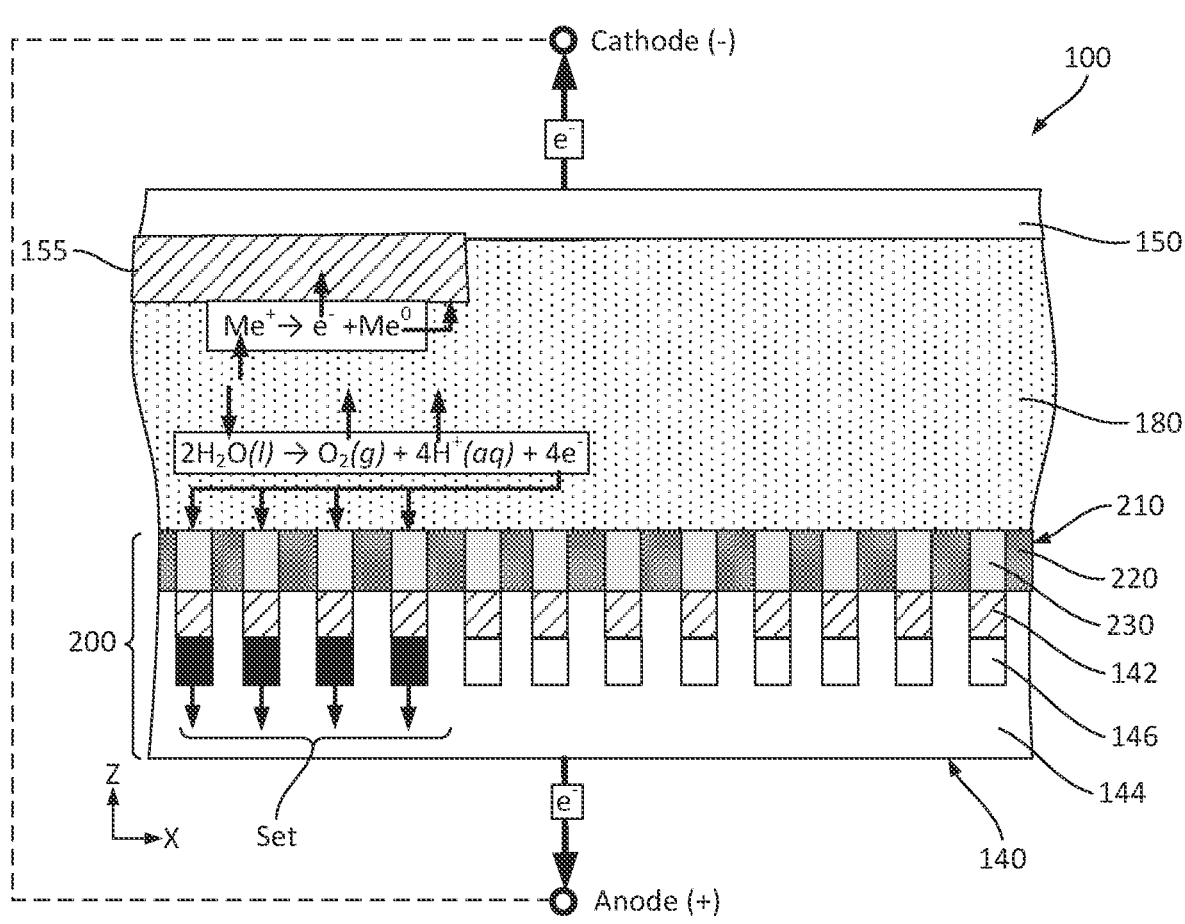
FIG. 2A is a schematic cross-sectional view of an ECAM system illustrating the electrolytic deposition of material from the electrolyte solution onto a deposition electrode, in accordance with some examples.
Figure 2B:
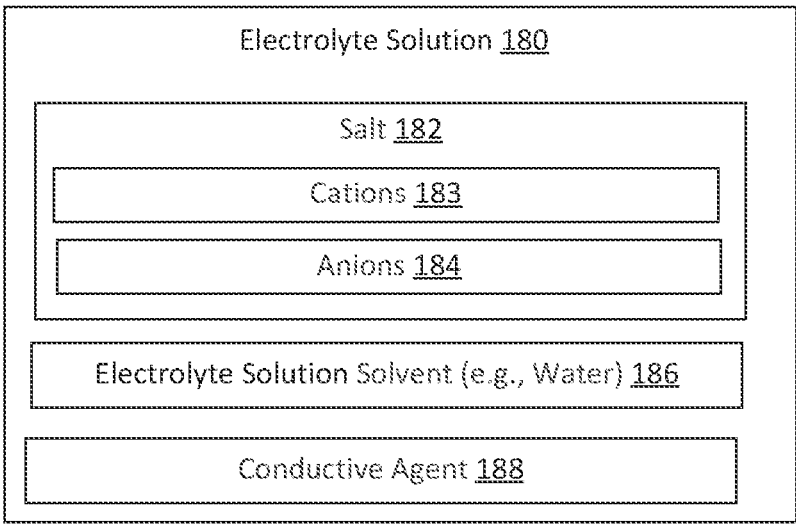
FIG. 2B is a block diagram illustrating various components of an electrolytic solution used for electrolytic deposition, in accordance with some examples.

FIG. 2A is a schematic expanded view of a portion of ECAM system 100 illustrating electrolyte solution 180 between protected electrode array assembly 200 (which may be referred to as a printhead) and deposition electrode 150, in accordance with some examples. FIG. 2B is a schematic block diagram illustrating different components of electrolyte solution 180. For example, electrolyte solution 180 may comprise salt 182, electrolyte solution solvent 186, and conductive agent 188. Salt comprises cations 183 and anions 184. Cations 183 can be in the form of metal ions, metal complexes, and the like. Some examples of cations 183 include metal cations (e.g., copper ions, nickel ions, tungsten ions, gold ions, silver ions, cobalt ions, chrome ions, iron ions, or tin ions), and other types of cations are within the scope. Some specific examples of salt 182 (feedstock ion sources) include but are not limited to copper sulfate, copper chloride, copper fluoroborate, copper pyrophosphate, nickel sulfate, nickel ammonium sulfate, nickel chloride, nickel fluoroborate, zinc sulfate, sodium thiocyanate, zinc chloride, ammonium chloride, sodium tungstate, cobalt chloride, cobalt sulfate, hydroxy acids, and aqua ammonia. In some examples, feedstock ion sources, or other sources of cations (e.g., salts) are referred to as material concentrates. Electrolyte solution solvent 186 can be water, which dissociates $(2H_2O \ (l) \Rightarrow O_2 \ (g) + 4H^+ \ (aq.) + 4e^-)$ on electrode-interface circuit 140 or, more specifically, on electrode connectors 142 that are activated during this operation. Specifically, the activated electrode connectors 142 are connected to deposition power supply 104 (by the corresponding deposition control circuits 146). In some examples, electrolyte solution 180 comprises catholyte conductive agent 188, such as an acid (e.g., sulfuric acid, acetic acid, hydrochloric acid, nitric acid, hydrofluoric acid, boric acid, citric acid, and phosphoric acid). In some examples, electrolyte solution 180 comprises one or more additives, such as a leveler, a suppressor, and an accelerator, particulates for co-deposition (e.g., nanoparticles and microparticles such that diamond particles, tungsten-carbide particles, chromium-carbide particles, and silicon-carbide particles).

In some examples, electrolyte solution 180 is provided in an electrolyte-carrying structure, e.g., sponge, porous film, mesh, and the like. The electrolyte-carrying structure can be advanced (e.g., can be rewound) between electrode-interface circuit 140 and deposition electrode 150 as electrolyte solution 180 is consumed. In some examples, electrode-interface circuit 140 and deposition electrode 150 are advanced toward each other to displace (squeeze) electrolyte solution 180 from the electrolyte-carrying structure.

Returning to the example shown in FIG. 2A, cations (e.g., metal cations are combined with electrons, which are supplied to deposition electrode 150 thereby forming material 155 (e.g., metal deposit—Me⁰). As noted above, the charge balance within electrolyte solution 180 is maintained by protons generated at protected electrode array assembly 200. It should be noted that only a set of interposer electrodes 230 (corresponding to the activated deposition control circuits 146, illustrated in black color) can be activated during this ECAM process resulting in electrolytic deposit/material 155 formed on a corresponding portion of deposition electrode 150. This corresponding portion is aligned with the activated interposer electrode 230 while the remaining portion of deposition electrode 150 remains free of electrolytic deposit. This selective deposition is a core ECAM feature provided by selective control of the current passing through the activated interposer electrodes 230.

Examples of Protected Electrode Array Assemblies

Figures 3D, 3E, 3F, 3G, 3H:
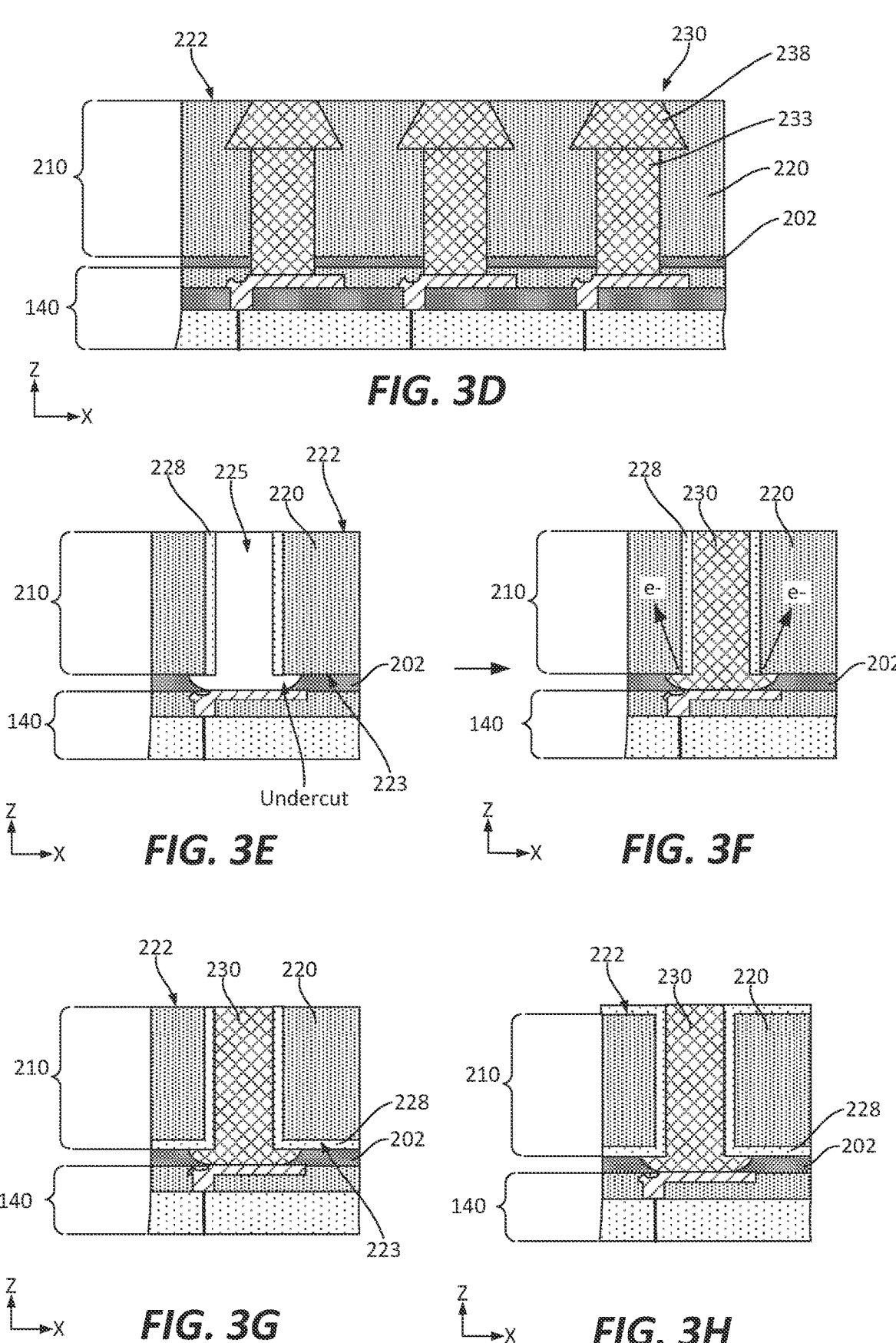
FIG. 3D is a schematic cross-sectional view of a protected electrode array assembly, in which the interposer electrodes comprise interposer conductors and electrode covers such that the electrode covers have a tapered shape for retention of the electrode covers in the interposer base, in accordance with some examples.
FIGS. 3E and 3F are schematic cross-sectional views of a protected electrode array assembly illustrating a potential problem with undercuts formed in an adhesive layer, in accordance with some examples.
FIGS. 3G and 3H are schematic cross-sectional views of a protected electrode array assembly illustrating a passivation layer extending between the interposer base and the electrode interface circuit, in accordance with some examples.

Additional examples and features of protected electrode array assembly 200 will now be described with reference to FIGS. 3A-3H. As noted above, protected electrode array assembly 200 comprises electrode interface circuit 140, interposer 210, and adhesive layer 202 mechanically supports interposer 210 on electrode interface circuit 140. Electrode interface circuit 140 comprises circuit base 144 and electrode connectors 142 supported by circuit base 144. Interposer 210 comprises interposer base 220 and interposer electrodes 230. Interposer electrodes 230 are connected to electrode connectors 142 of the electrode interface circuit 140 and form an electrode array. The adhesive layer 202 is positioned at least between circuit base 144 and interposer base 220. In some examples, adhesive layer 202 does not extend between interposer electrodes 230 and electrode connectors 142. In these examples, interposer electrodes 230 directly interface electrode connectors 142, e.g., as schematically shown in FIG. 3A. In these examples, adhesive layer 202 can be patterned (to keep away from these interfaces) and can comprise one of benzo-cyclobutene (BCB), polyimide (PI), and epoxy-based photoresists (e.g., SU-8, PermiNex®, etc.). In some examples, interposer base 220 comprises one or more materials selected from a group consisting of silicon, glass, sapphire, silicon nitride, silicon dioxide, silicon oxynitride, and aluminum oxide.

Alternatively, adhesive layer 202 can be an anisotropic adhesive layer further extending between electrode connectors 142 and interposer electrodes 230. In these examples, the first portion of the adhesive layer 202, extending between electrode connectors 142 and interposer electrodes 230, is electrically conductive. The electrical conductivity is achieved by compressing this first portion beyond a threshold that causes the internal material transformation (e.g., bursting of internal structures containing conductive particles and allowing these conductive particles to interconnect). The second portion of the adhesive layer 202, extending between circuit base 144 and interposer base 220 is electrically nonconductive. This second portion is not compressed beyond the threshold.

Referring to FIG. 3A, in some examples, interposer electrodes 230 have a uniform composition throughout an entire volume of interposer electrodes 230. For example, the surface of interposer electrodes 230, which comes in contact with electrolyte solution 180, and the opposite surface, which interfaces with electrode connectors 142, can have the same composition. For example, the entire interposer electrodes 230 can be formed from platinum, titanium, and layered combinations of such material, such as PtIr, PtRu, PtRh, Ta, Nb, SiB, and the like.

Referring to FIG. 3B, in other examples, each interposer electrode 230 comprises interposer conductor 233 and electrode cover 235 such that interposer conductor 233 is positioned between electrode cover 235 and a corresponding one of electrode connectors 142. Interposer conductor 233 and electrode cover 235 have different compositions. Electrode cover 235 is designed to come in contact with electrolyte solution 180, while interposer conductor 233 is protected from electrolyte solution 180 by electrode cover 235. For example, electrode cover 235 comprises platinum, while interposer conductor 233 comprises polysilicon.

Referring to FIG. 3C, in some examples, electrode cover 235 comprises an anchoring edge 238 interlocked within interposer base 220 and/or base cover 236 (if the base cover 236 is present). The anchoring edge 238 helps to mechanically support electrode cover 235 and maintain the connection between electrode cover 235 and interposer conductor 233. This anchoring edge 238 can be formed using deep reactive ion etching (DRIE) and/or layered structures (formed from different materials) used for the interposer base 220 or, more specifically, for the base cover 236. For example, the materials for different layers of this layered structure can be selected to have different etch rates to produce a shape like the one shown in FIG. 3C.

Referring to FIG. 3D, in some examples, electrode cover 235 has a first side and a second side, opposite of the first side and facing the corresponding one of electrode connectors 142. The second side is wider than the first side, meaning that electrode cover 235 has a tapered cross-sectional shape which helps to mechanically support electrode cover 235 and maintain the connection between electrode cover 235 and interposer conductor 233. This tapered shape can be achieved by reactive ion etching (RIE) or, more specifically, deep reactive ion etching (DRIE) while forming vias 225 in interposer base 220 (with these vias 225 later filed with electrode cover 235). It has been found that increasing the DRIE rate increased the taper, which can be also referred to as scalloping. For example, when performing a DRIE process or, more specifically, a Bosch DRIE process, two repeating cycles can be used: (1) an isotropic plasma etch and (2) a deposition of a passivation layer. After the etch cycle, the sidewalls are coated with a passivation layer to protect them from further etch. This cycle is repeated until a desired etching depth is achieved. Conventionally, the process uses short etch cycles to form nearly vertical sidewalls. However, increasing the etching duration produces significant sidewall scalloping, which can be used as anchors for interposer electrode 230 or, more specifically, for electrode cover 235, e.g., as shown in FIG. 3D. Furthermore, the plasma process parameters (e.g., pressure, gas flow rates, etch chemistry, and ion density) can be tuned to make the etch more isotropic if desired and increase the scalloping/taper. Furthermore, layered structures formed from materials having different etch rates can be also used to produce these scalloped/tapered structures.

Referring to FIGS. 3A-3D, in some examples, a first interface, which is formed by interposer electrodes 230 and electrode connectors 142, is offset relative to a second interface, which is formed by circuit base 144 and adhesive layer 202. In other words, the first interface is positioned below the second interface (at least with reference to the Z-axis in FIGS. 3A-3D). Referring to FIG. 3A, in some examples, interposer electrodes 230 protrude above interposer base 220 and form a cap over the surface of interposer base 220 facing away from electrode interface circuit 140.

FIGS. 3E-3H illustrate different examples of passivation layer 228. Specifically, FIGS. 3E and 3F illustrate an example of passivation layer 228 positioned on the side walls of vias 225 but not on primary surface 222 (also known as "field") of interposer base 220. For example, primary surface 222 and secondary surface 223 (opposite of primary surface 222) can be processed using CMP, which removes any previously formed layers. However, not having a passivation layer 228 over the secondary surface 223 can create a potential current leakage. For example, adhesive layer 202 can be undercut (pushed away from the boundaries of vias 225) as shown in FIG. 3E. Undercut can be a result of the isotropic etch that occurs when etching the adhesive layer. The etching process may be tuned to be minimal. However, the undercut is inherently present and is undesirable.

Figure 4:
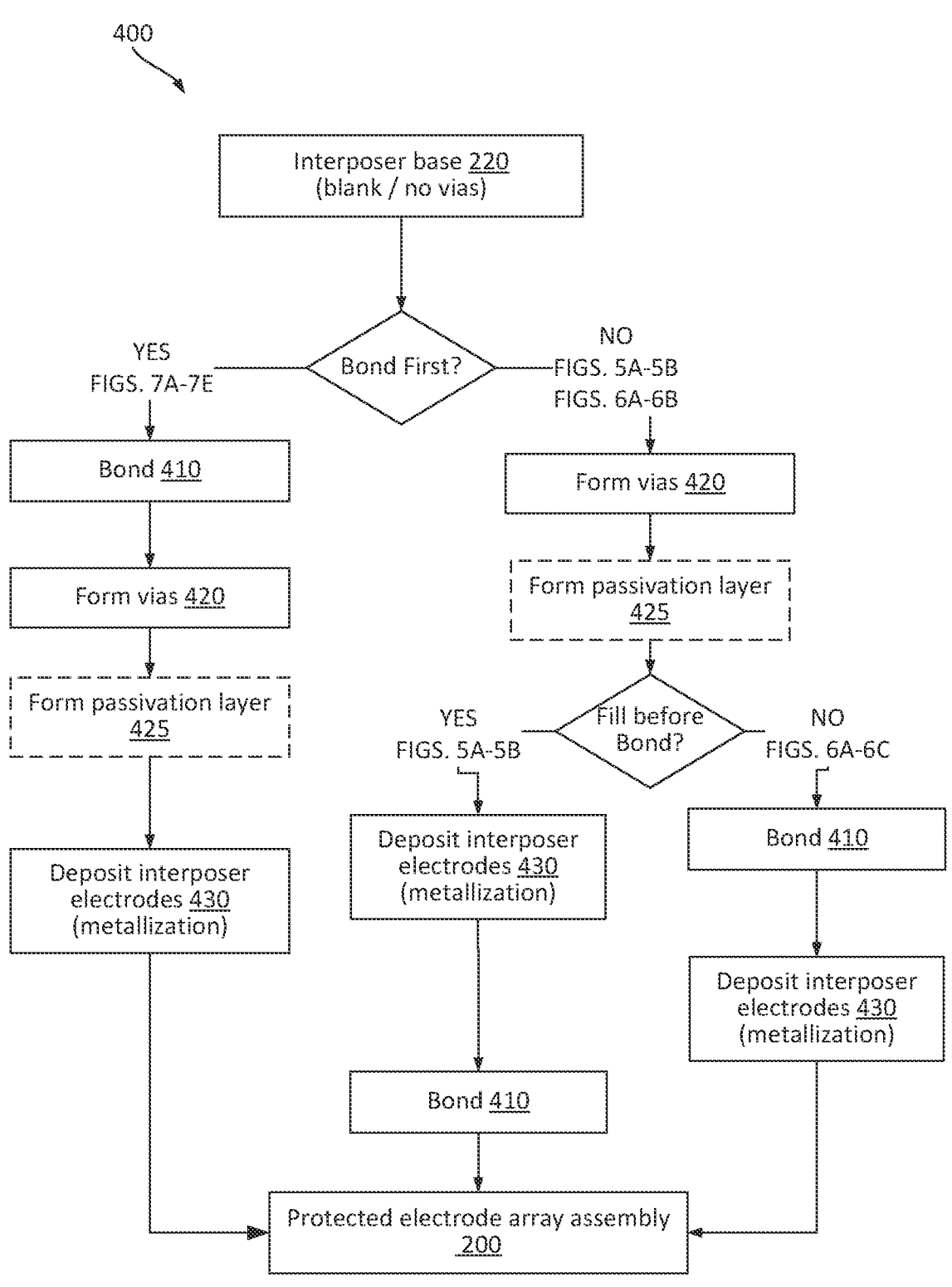
FIG. 4 is a general process flowchart corresponding to a method of fabricating a protected electrode array assembly and covering different orders of the bonding, via-forming, and electrode-depositing operations, in accordance with some examples.

When interposer electrode 230 is deposited inside vias 225, some portions of these interposer electrodes 230 can extend into these undercuts and directly interface with interposer base 220. Depending on the material of interposer base 220 (e.g., silicon), the interposer base 220 can be at least partially conductive such that this direct contact should be avoided. This issue is addressed by extending passivation layer 228 over secondary surface 223, e.g., as shown in FIG. 3G. In this example, passivation layer 228 extends between interposer base 220 and adhesive layer 202. Furthermore, this portion of the passivation layer 228 also extends to the portion of the passivation layer 228 positioned on the sidewalls of vias 225 (which in FIG. 3G is filled with interposer electrodes 230). As such, there is no direct contact between interposer base 220 and interposer electrode 230. In this example, primary surface 222 is not covered by passivation layer 228. In other examples, referring to FIG. 3H, primary surface 222 is also covered by passivation layer 228. Passivation layer 228 on the primary surface 222 can be used to maintain the interposer electrodes 230 (which can be referred to as pixels) electrically isolated from one another. The top passivation layer (i.e., the passivation layer 228 on the primary surface 222) may not be required if interposer electrodes 230 are contained within the vias 225, e.g., do not protrude from the vias 225 and, in some examples, even do not reach the primary surface 222. Various examples of passivation layer 228 are within the scope. For example, passivation layer 228 can be a thermal oxide (e.g., SiOx) formed by oxidation of the material of interposer base 220. Examples of Fabricating Protected Electrode Array Assemblies FIG. 4 is a general process flowchart corresponding to various examples of method 400 of fabricating protected electrode array assembly 200. These examples include a "vias-fill-bond" example (further described below with reference to FIGS. 5A-5B), a "vias-bond-fill" example (further described below with reference to FIGS. 6A-6C), and a "bond-vias-fill/bonding first" example (further described below with reference to FIGS. 7A-7C). It should be noted that vias are always formed before via filing (depositing the electrodes inside these vias), but the bonding operation can occur either before the via-formation operation, in between the via-formation and the fill/electrode-deposition operation, or after the fill/electrode-deposition operation. The relationship between these examples and key operations will now be described with reference to FIG. 4.

Referring to the process flowchart in FIG. 4, method 400 commences with providing an interposer base 220 (which has no vias and which may be referred to as a "blank"). Interposer base 220 is processed using various operations shown in FIG. 4 (and later figures), which yield a protected electrode array assembly 200. The first decision block separates the "bonding first" example from the two other examples, i.e., the "vias-bond-fill" and "vias-fill-bond" sequences.

Figures 5A, 5B:
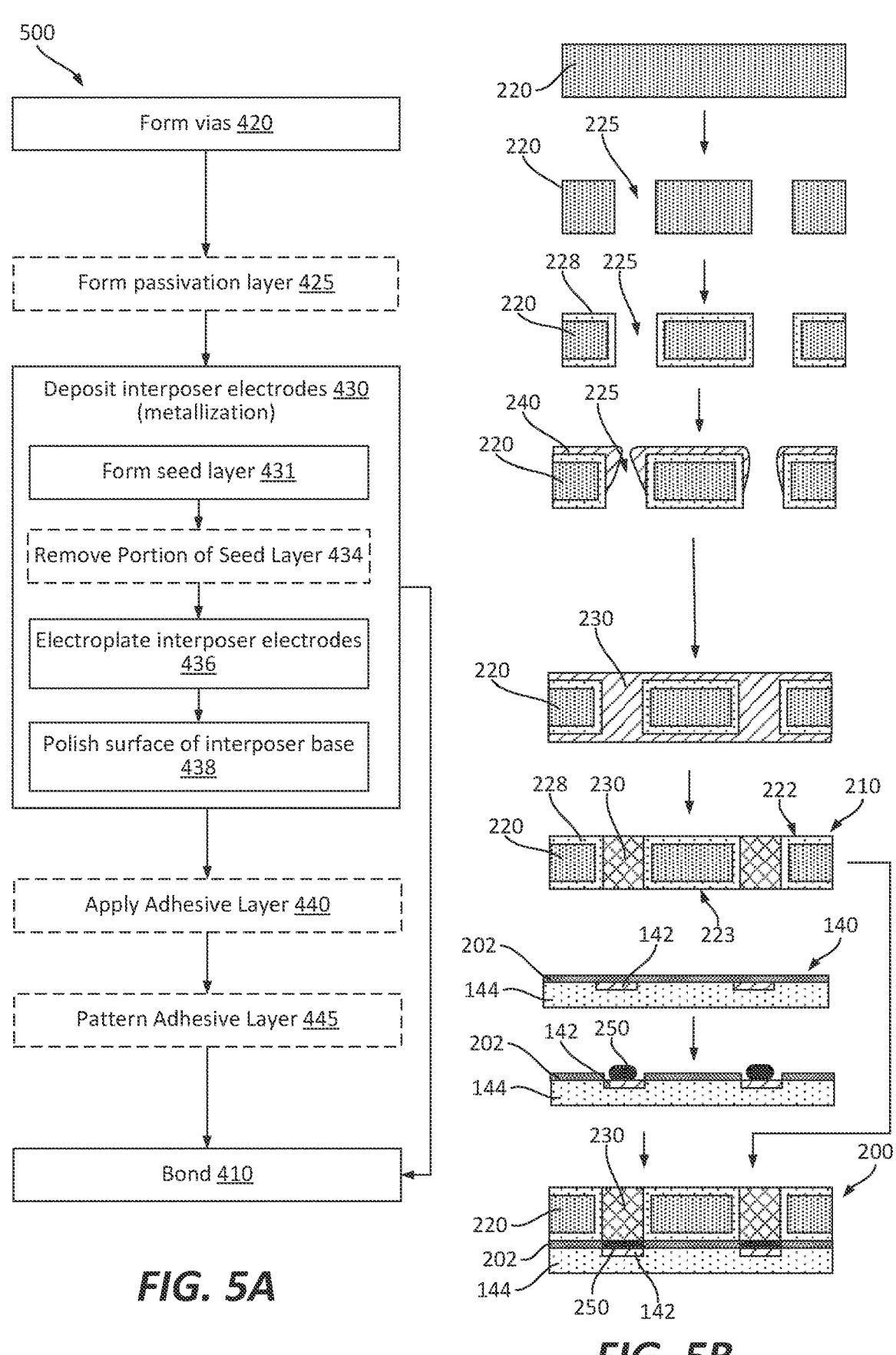
FIG. 5A is a process flowchart corresponding to a method of fabricating a protected electrode array assembly in which the via-forming operation precedes the electrode-depositing operation and in which the bonding operation follows the electrode-depositing operation, in accordance with some examples.
FIG. 5B illustrates schematic cross-sectional views of various subassemblies at different stages of the method in FIG. 5A, in accordance with some examples.

Specifically, in the "bonding first", interposer base 220 is bonded to the electrode interface circuit 140 before forming any vias 225 in interposer base 220. Some aspects of this bonding operation (block 410) may be the same regardless of when this operation is performed, e.g., (a) as an initial operation, which is the "bonding first" example, (b) after forming vias (block 420) and before depositing electrodes (block 430), which is the "vias-bond-fill" example, or (c) after depositing the electrodes (block 430), which is the "vias-fill-bond" example. For example, the bonding operation (block 410) may involve forming a stack of interposer base 220, adhesive layer 202, and electrode interface circuit 140 such that adhesive layer 202 is positioned between interposer base 220 and electrode interface circuit 140 and supports these two components with respect to each other. Examples of "Vias-Fill-Bond" Processing Sequences FIG. 5A illustrates a process flowchart corresponding to method 500 of fabricating protected electrode array assembly 200, which may be also referred to as a "vias-fill-bond" sequence and which represents one of the examples of general method 400, described above with reference to FIG. 4. As such, key operations of method 400 (e.g., block 410, block 420, and block 430) are also parts of method 500 and are shown in FIG. 5A. FIG. 5B illustrates various components at different stages of this method.

Method 500 may commence with (block 420) forming the vias 225 in interposer base 220. Various techniques are within the scope: (a) a plasma etch step of directing plasma to a surface of interposer base 220 thereby creating a trench comprising a bottom and side walls, (b) a deposition step of depositing a chemically inert passivation layer on side walls and bottom of the trench, and (c) repeating the plasma etch step and the deposition step until vias 225 are formed through interposer base 220. In some examples, the plasma in the plasma etch step is formed using sulfur hexafluoride (SF$_6$). The chemically inert passivation layer may comprise a fluorocarbon.

It should be noted that in this "vias-fill-bond" example, interposer base 220 is not bonded to the electrode interface circuit 140, which opens the door to new methods for forming and filling the vias 225 that are not available when the electrode interface circuit 140 is present during these operations. For example, the electrode interface circuit 140 can be potentially damaged when exposed to certain chemicals (e.g., plating solutions), and process conditions (e.g., high temperatures, electric fields, etc.).

In some examples, method 500 comprises (block 425) forming a passivation layer 228 on the interposer base 220 using thermal oxidation of the interposer base 220. This operation is optional and may be performed after the via-forming operation (block 420) as shown in FIGS. 5A and 5B or performed before the via-forming operation (not shown). For example, when the passivation layer 228 layer is formed on interposer base 220 with vias 225, passivation layer 228 can extend into vias 225. During this passivation layer formation (block 425), interposer base 220 can be exposed to an oxygen-containing environment at an elevated temperature. Various examples of passivation layer 228 are described above.

The process also involves (block 430) depositing the interposer electrodes 230 at least partially within vias 225 in interposer base 220. This electrode deposition operation may involve (block 431) forming seed layer 240 at least partially extending into vias 225 and over the surface of interposer base 220. Various techniques (e.g., sputtering/physical vapor deposition (PVD), plasma-enhanced chemical vapor deposition (PECVD), and atomic layer deposition (ALD) can be used for this operation. An example of the sputtered seed layer 240 is shown in FIG. 5B, while an example of the ALD-formed seed layer 240 (not shown) will have a uniform thickness due to the nature of the deposition technique.

In some examples, the process may involve filing vias 225 with temporary plugs 245, e.g., to protect the vias 225 from contamination during later operations (e.g., CMP). This process is further described below with reference to the examples in which electrode interface circuit 140 and in which cleaning the vias 225 can be particularly challenging. Overall, this is an optional operation and may not be used in this "vias-fill-bond" example.

In some examples, method 500 may proceed with (block 434) removing a portion of the seed layer 240 extending over the surface of interposer base 220 (not shown in FIG. 5B). In this instance, seed layer 240 allows for a metal-to-metal bond to occur on the side walls of the vias 225 during the electroplating process (irrespective of the technique of via filling).

Method 500 then proceeds with (block 436) electroplating the interposer electrodes 230 into vias 225. For example, an electrolyte solution comprising a salt of the desired metal (e.g., copper, titanium, Pt, Pt-Alloy) can be used in this operation. The vias 225 can have a relatively high aspect ratio, especially for non-standard chemistries (e.g., Pt and Pt-alloys).

In some examples, method 500 then proceeds with (block 438) polishing the primary surface 222 and/or secondary surface 223 of interposer base 220, e.g., to remove any overburden formed in these surfaces while electroplating the interposer electrodes 230. In some examples, this operation involves CMP. The passivation layer 228 can be preserved on the primary surface 222 and/or the secondary surface 223 during this polishing operation since the CMP technique is very precise.

In some examples, method 500 proceeds with (block 440) applying the adhesive layer 202. The adhesive layer 202 can be applied to electrode-interface circuit 140 (e.g., as shown in FIG. 5B), to interposer base 220 (e.g., to the secondary surface 223 of the interposer base 220), or both. Some examples of adhesive layer 202 are described above. This operation is performed before stacking electrode-interface circuit 140 and interposer base 220. Furthermore, this operation is optional (at least at this stage). In some examples, adhesive layer 202 can be formed after stacking electrode-interface circuit 140 and interposer base 220 (e.g., by flowing liquid adhesive between electrode-interface circuit 140 and interposer base 220).

When adhesive layer 202 is applied, method 500 may proceed with (block 445) patterning the adhesive layer 202, e.g., to expose the electrode connectors 142 (when adhesive layer 202 is applied to electrode-interface circuit 140) and/or to expose the interposer electrodes 230 (when adhesive layer 202 is applied to interposer base 220). Furthermore, when an anisotropic adhesive is used for the adhesive layer 202, the patterning may not be needed.

In some examples, method 500 then proceeds with (block 410) bonding electrode-interface circuit 140 and interposer base 220. In this "vias-fill-bond" example, this may be the last operation in the sequence, and protected electrode array assembly 200 may be complete at this point. One having ordinary skill in the art would recognize that additional operations may be used, e.g., for integrating the protected electrode array assembly 200 into an ECAM system 100.

Specifically, the bonding operation may involve forming the electrical connections between interposer electrodes 230 and electrode connectors 142 and, in some examples, the mechanical attachment between the interposer base 220 and the circuit base 144. The electrical connections may be formed using an anisotropic adhesive (e.g., by compressing the anisotropic adhesive beyond the electrical conductivity threshold at the interface between interposer electrodes 230 and electrode connectors 142), solder bumps 250 (e.g., shown in FIG. 5B), and other like techniques.

Figures 6A, 6C:
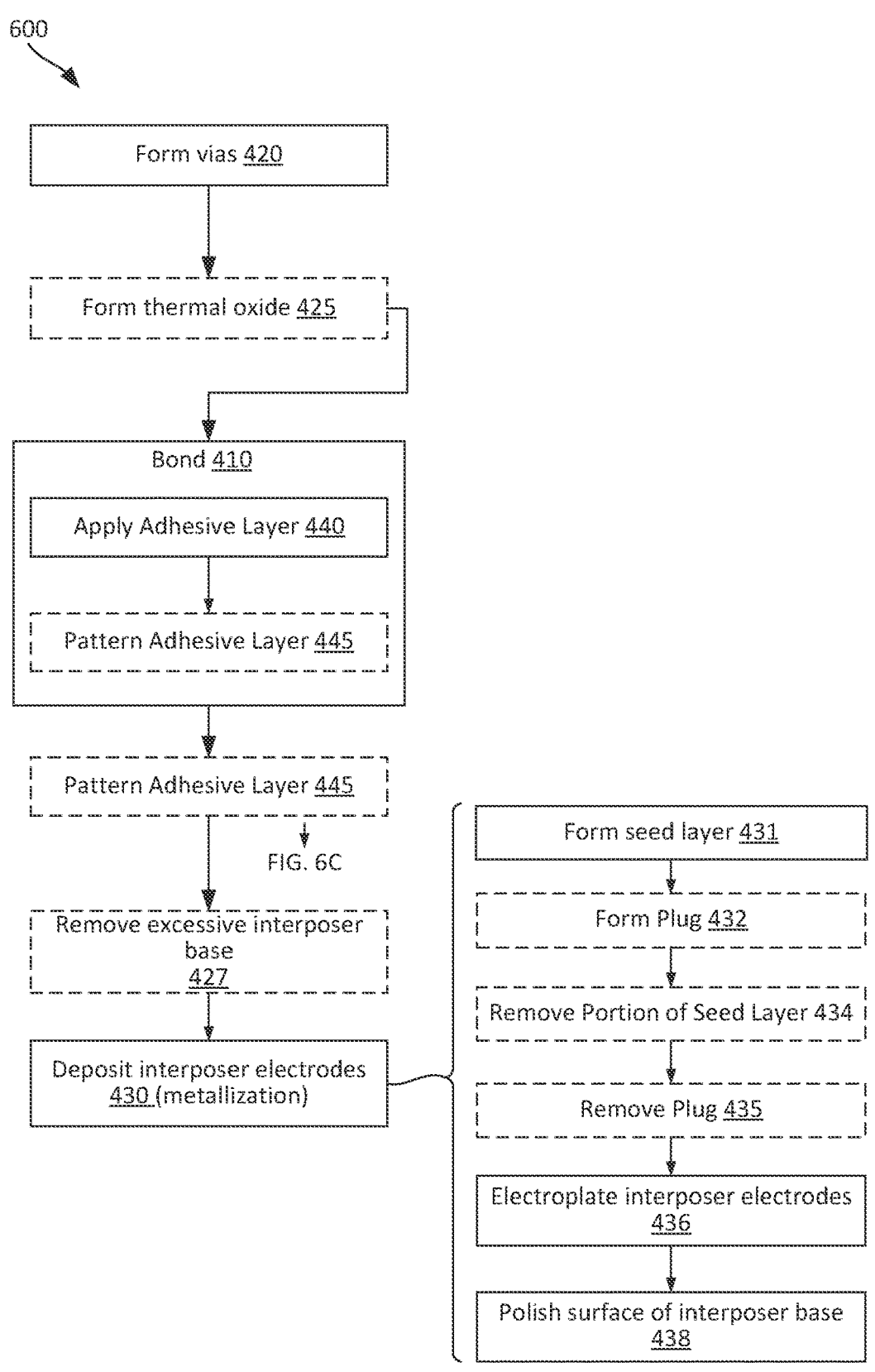
FIG. 6A is a process flowchart corresponding to a method of fabricating a protected electrode array assembly in which the via-forming operation precedes the bonding operation and in which the bonding operation precedes the electrode-depositing operation, in accordance with some examples.
FIGS. 6B and 6C illustrate schematic cross-sectional views of various subassemblies at different stages of the method in FIG. 6A, in accordance with some examples.
Figures 6B, 6C:
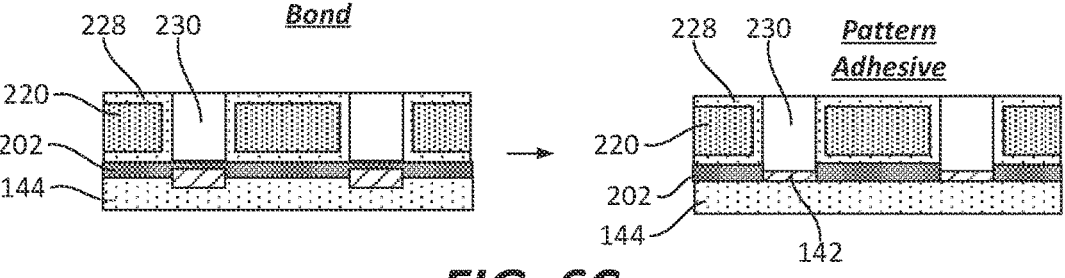

The mechanical attachment between the interposer base 220 and the circuit base 144 can be formed by (a) adhesive bonding via benzo-cyclobutene (BCB), polyimide (PI), epoxy-based photoresists such as SU-8, PermiNex®, etc.—may require high temperature and chemical resistance; (b) bump bonding—may require additional processing steps, high risk; (c) eutectic—for specific material compatibilities; (d) Au—Au thermo-compression-possibly additional processing steps, generally high alignment/resolution requirement, may introduce the risk of shorting; (e) anodic materials/compatibility and high flatness; (f) silicon fusion, which may require high temperature; and (g) glass frit, which may require high temperature, may be hard to pattern. Examples of "Vias-Bond-Fill" Processing Sequences FIG. 6A illustrates a process flowchart corresponding to method 600 of fabricating protected electrode array assembly 200, which may be also referred to as a "vias-bond-fill" sequence. FIG. 6B illustrates various components at different stages of this method. Method 600 may commence with (block 420) forming a set of vias 225 in interposer base 220 and, optionally, forming a passivation layer 228 on the interposer base 220 as described above with reference to FIG. 5A. After this operation, method 600 diverges from method 500. Specifically, method 600 proceeds with (block 410) bonding of interposer base 220 to electrode-interface circuit 140. It should be noted that interposer electrodes 230 are not yet provided in interposer base 220 at the time of this bonding operation. As such, this bonding operation involves the mechanical attachment between the interposer base 220 and the circuit base 144 but does not involve forming the electrical connections between interposer electrodes 230 and electrode connectors 142. These electrical connections are formed while depositing the interposer electrodes 230, which is described below with reference to block 430.

The mechanical attachment between the interposer base 220 and the circuit base 144 may be performed using an adhesive layer 202. The adhesive layer application operation (block 440) and the adhesive layer patterning operation (block 445) are described above, and this description also applies to this sequence of operations. It should be noted that the mechanical attachment between the interposer base 220 and the circuit base 144 can be performed before stacking interposer base 220 and the circuit base 144 (e.g., as shown in FIG. 6B) or after this stacking (e.g., as shown in FIG. 6C).

Method 600 may proceed with (block 430) depositing interposer electrodes 230 in vias 225. This electrode-depositing operation may involve multiple steps, some of which were described above with reference to method 500, e.g., the seed-layer forming operation (block 431), removing a portion of the seed layer 240 (block 434), electroplating the interposer electrodes 230 into vias 225 (block 436), and polishing the primary surface 222 of interposer base 220 (block 438). It should be noted that secondary surface 223 is already bonded to electrode-interface circuit 140 during these operations and is not available for processing. Also, it should be noted that adhesive layer 202 and electrode-interface circuit 140 are parts of the stack (also comprising interposer base 220) involved in these operations, which may restrict some processing conditions and/or techniques used, such as when electrode-interface circuit 140 is present, using some electroplating techniques, and more general having various temperature and/or chemical compatibility restrictions. Furthermore, various rigging and fixturing may be needed to protect the electrode-interface circuit 140 from getting exposed to the processing environment.

Finally, it should be noted that vias 225 are no longer accessible from both sides, i.e., with one side blocked by electrode-interface circuit 140. In other words, vias 225 are effectively blind holes with electrode connectors 142 forming the bottom of these vias 225. As such, cleaning all these vias 225 can be particularly challenging in this example. With that, in some examples, method 600 comprises (block 432) filing vias 225 with temporary plugs 245, which protect vias 225 from contamination during later operations (e.g., CMP). Some examples of temporary plugs 245 include a protective resist layer (PRL) and a spin-on/temporary polymer (which can be dissolved away later). Finally, in these examples, method 600 may proceed with (block 435) removing temporary plugs 245 from the vias 225.

Examples of "Bond-Via-Fill" Processing Sequences

Figure 7A:
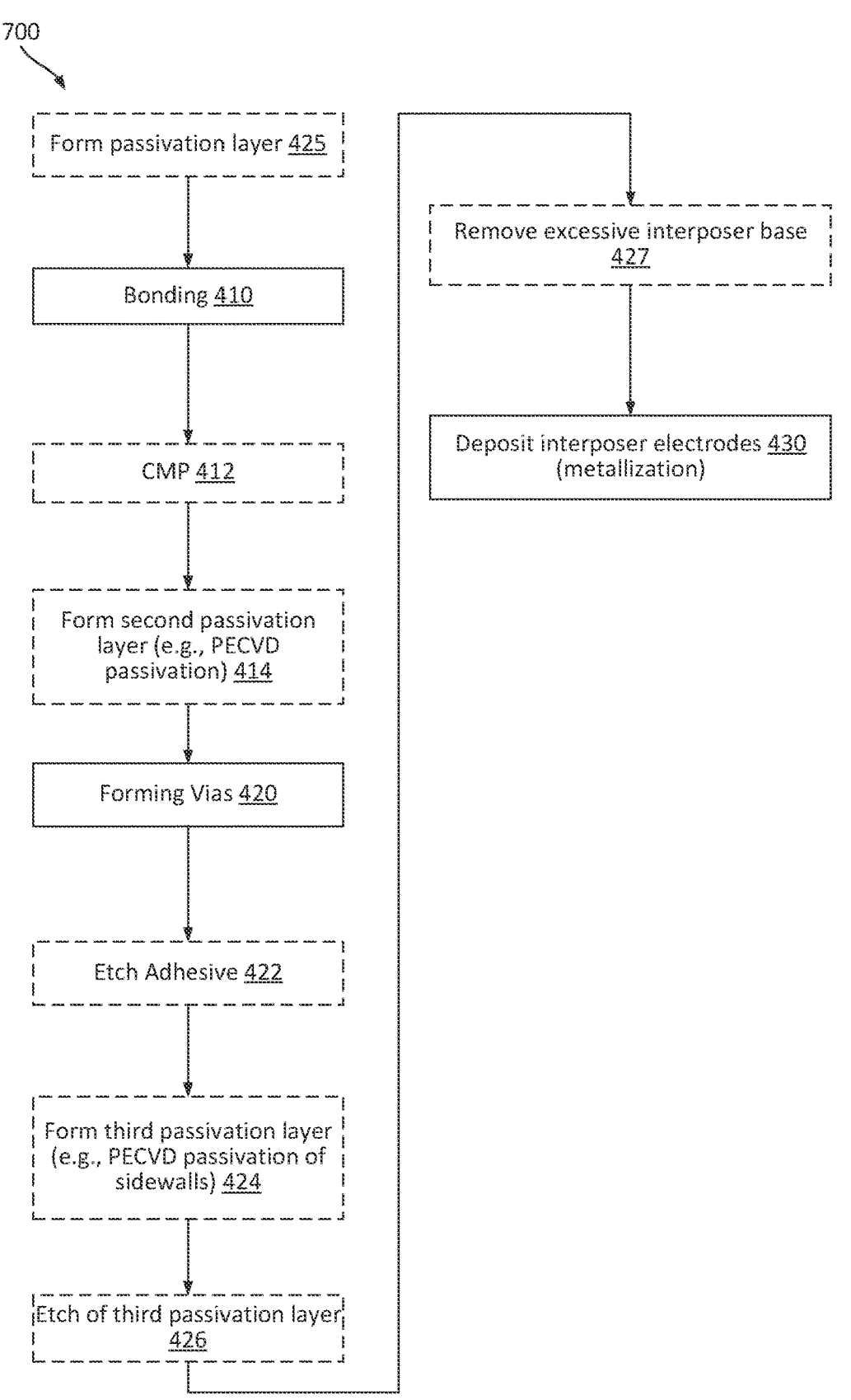
FIG. 7A is a process flowchart corresponding to a method of fabricating a protected electrode array assembly in which the bonding operation precedes both the via-forming operation and the electrode-depositing operation, in accordance with some examples.
Figure 7B:
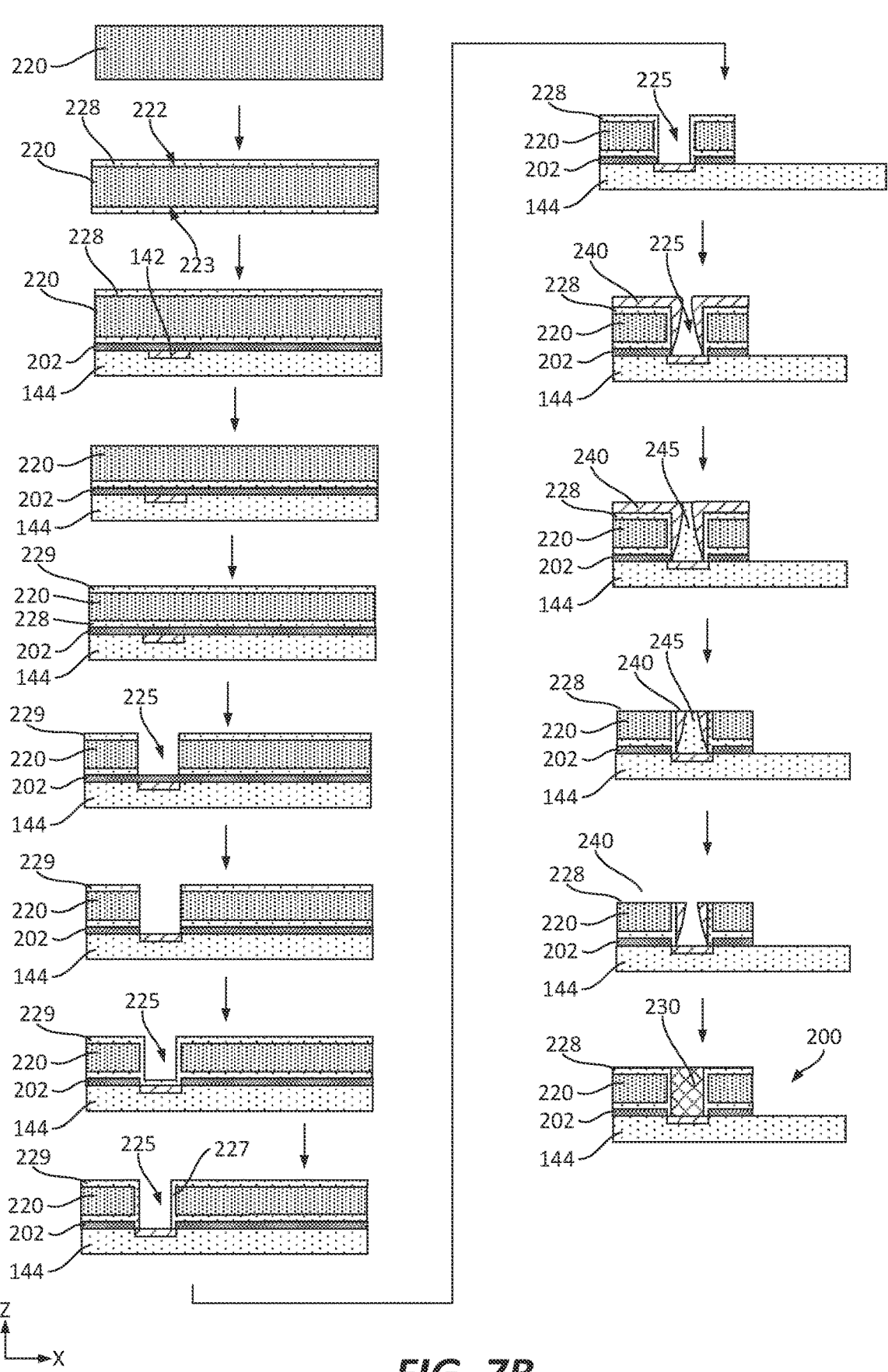
FIGS. 7B and 7C illustrate schematic cross-sectional views of various subassemblies at different stages of the method in FIG. 7A, in accordance with some examples.
Figure 7C:
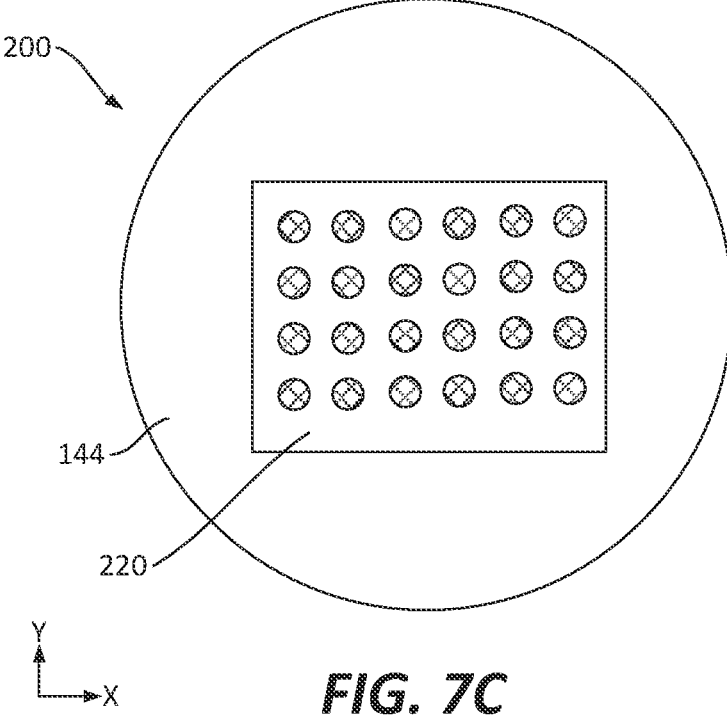

FIG. 7A illustrates a process flowchart corresponding to method 700 of fabricating protected electrode array assembly 200, which may be also referred to as a "bond-via-fill" sequence. FIG. 7B illustrates cross-sectional views of various components at different stages of this method. Finally, FIG. 7C illustrates a top view of protected electrode array assembly 200 positioned on circuit base 144.

Method 700 may commence with (block 425) forming a passivation layer 228 on the interposer base 220, e.g., using thermal oxidation. Some aspects of this operation are described above. As shown in FIG. 7B, passivation layer 228 can be formed on both the primary surface 222 and the secondary surface 223. It should be noted that at this point, interposer base 220 is still not bound to electrode-interface circuit 140 and can be exposed to higher temperatures (than after the two components are bound). Specifically, electrode-interface circuit 140 can include temperature-sensitive electronic components (e.g., transistors) that can be damaged during thermal oxidation.

Method 700 may continue with (block 410) bonding the interposer base 220 to electrode-interface circuit 140. Some aspects of this operation are described above. As shown in FIG. 7B, adhesive layer 202 can be used during this operation and positioned between interposer base 220 and electrode-interface circuit 140.

Method 700 may continue with (block 412) chemical mechanical polishing (CMP) of the thermal oxide from the primary surface 222. This removal may be needed to ensure that the interposer base 220 can be processed to form vias 225. More specifically, the thermal oxide layer may be replaced with a second passivation layer 229, e.g., (block 414) depositing the second passivation layer 229 using PECVD. Specifically, thermal oxidation cannot be performed in some examples when the electrode-interface circuit 140 is present because of temperature limitations of electrode-interface circuit 140.

Method 700 may continue with (block 420) forming vias 225. Some aspects of this operation are described above, e.g., with reference to FIGS. 5A-5B. For example, RIE can be used. In some examples, method 700 may proceed with (block 422) etching portions of the adhesive layer 202 positioned at the bottom of each via 225 thereby exposing electrode connectors 142 of electrode-interface circuit 140.

In some examples, method 700 may proceed with (block 424) forming a third passivation layer 227, e.g., using PECVD. This third passivation layer 227 may extend on the sidewalls of the vias 225. If this third passivation layer 227 extends over the electrode connectors 142 of electrode-interface circuit 140, method 700 may proceed with (block 426) etching portions of this third passivation layer 227 positioned at the bottom of each via 225 thereby exposing electrode connectors 142 of electrode-interface circuit 140. The third passivation layer 227 can be used to cover the sidewalls of the vias 225.

In some examples, method 700 may proceed with (block 427) removing the excess of the interposer base 220 (e.g., with all vias 225) prior to depositing interposer electrodes 230. This operation allows for reducing the consumption of various materials used for interposer electrodes 230 (e.g., platinum). For example, electrode-interface circuit 140 may have a larger footprint than the need for interposer base 220, e.g., as schematically shown in FIG. 7C.

Method 700 may proceed with (block 430) depositing interposer electrodes 230 in vias 225. This electrode-depositing operation may involve multiple steps, some of which were described above with reference to method 500, e.g., the seed-layer forming operation (block 431), removing a portion of the seed layer 240 (block 434), electroplating the interposer electrodes 230 into vias 225 (block 436), and polishing the primary surface 222 of interposer base 220 (block 438). It should be noted that secondary surface 223 is already bonded to electrode-interface circuit 140 during these operations and is not available for processing. Also, it should be noted that adhesive layer 202 and electrode-interface circuit 140 are parts of the stack (also comprising interposer base 220) involved in these operations, which may restrict some processing conditions and/or techniques used.

Finally, it should be noted that vias 225 (e.g., while depositing the interposer electrodes 230) are no longer accessing from both sides, i.e., with one side blocked by electrode-interface circuit 140 (similar as in the "via-bond-fill" example described above with reference FIGS. 6A-6C). As noted above, cleaning all these vias 225 can be particularly challenging in this example. With that, in some examples, method 600 comprises (block 432) filing vias 225 with temporary plugs 245, which protect vias 225 from contamination during later operations (e.g., CMP). Finally, in these examples, method 600 may proceed with (block 435) removing temporary plugs 245 from vias 225.

CONCLUSION

Although the foregoing concepts have been described in some detail for purposes of clarity of understanding, it will be apparent that certain changes and modifications may be practiced within the scope of the appended claims. It should be noted that there are many alternative ways of implementing processes, systems, and apparatuses. Accordingly, the present embodiments are to be considered illustrative and not restrictive.

The invention claimed is:

1. A method of fabricating a protected electrode array assembly, the method comprising:

forming a passivation layer on an interposer base;

bonding the interposer base to an electrode interface circuit using an adhesive layer, wherein:

the electrode interface circuit comprises a circuit base and electrode connectors supported within the circuit base, and the adhesive layer is positioned between the circuit base and the interposer base;

after bonding the interposer base, forming vias in the interposer base using a technique comprising:

a plasma etch step of directing plasma to the interposer base thereby creating a trench comprising a bottom and side walls, a deposition step of depositing a chemically inert passivation layer on the side walls and the bottom of the trench, and repeating the plasma etch step and the deposition step until the vias are formed; and after forming the vias, depositing interposer electrodes at least partially within the vias in the interposer base thereby forming the interposer, which is a part of the protected electrode array assembly, wherein each of the electrode connectors is electrically coupled and mechanically attached to the interposer electrodes after depositing the interposer electrodes.

2. The method of claim 1, wherein the passivation layer is formed using thermal oxidation of the interposer base.

3. The method of claim 1, wherein:

the interposer base comprises a primary surface and a secondary surface, opposite to the primary surface, and the passivation layer is formed on at least a secondary surface.

4. The method of claim 3, wherein the passivation layer is also formed on a primary surface, opposite of the secondary surface.

5. The method of claim 4, further comprising, prior to forming the vias in the interposer base, removing the passivation layer from the primary surface.

6. The method of claim 5, wherein the passivation layer on the secondary surface is retained after removing the passivation layer from the primary surface.

7. The method of claim 5, further comprising, after removing the passivation layer from the primary surface, depositing a second passivation layer on the primary surface using plasma-enhanced chemical vapor deposition (PECVD).

8. The method of claim 1, wherein, after forming the vias in the interposer base, the vias extend to but not through the adhesive layer.

9. The method of claim 8, further comprising, after forming the vias in the interposer base, removing portions of the adhesive layer exposed in the vias thereby exposing the electrode connectors of the electrode interface circuit within the vias.

10. The method of claim 9, wherein removing the portions of the adhesive layer exposed in the vias comprises one of (a) etching the portions of the adhesive layer and (b) dissolving the portions of the adhesive layer.

11. The method of claim 1, further comprising, after forming the vias in the interposer base, forming a third passivation layer at least on sidewalls of the vias using plasma-enhanced chemical vapor deposition (PECVD), and etching portions of the third passivation layer at bottoms of the vias thereby exposing the electrode connectors of the electrode interface circuit within the vias.

12. The method of claim 1, wherein:

the plasma in the plasma etch step is formed using sulfur hexafluoride ($SF_6$), and the chemically inert passivation layer comprises a fluorocarbon.

13. The method of claim 1, wherein the interposer base comprises one or more materials selected from the group consisting of silicon, glass, sapphire, silicon nitride, silicon dioxide, silicon oxynitride, and aluminum oxide.

14. The method of claim 1, wherein the interposer base comprises glass.

15. The method of claim 1, wherein the interposer base comprises silicon.

16. The method of claim 1, wherein depositing the interposer electrodes comprises:

sputtering a seed layer at least partially extending into the vias and over a surface of the interposer base; and electroplating the interposer electrodes into the vias.

17. The method of claim 16, wherein depositing the interposer electrodes further comprises polishing off the surface of the interposer base thereby removing a portion of the interposer electrodes extending over the surface of the interposer base.

18. The method of claim 16, wherein depositing the interposer electrodes comprises:

prior to electroplating the interposer electrodes into the vias, filing the vias with temporary plugs, removing a portion of the seed layer extending over the surface of the interposer base, and removing the temporary plugs from the vias.

19. The method of claim 1, further comprising depositing a base cover, wherein:

the base cover comprises electrode openings, exposing a portion of the interposer electrodes, and the interposer base is positioned between the base cover and electrode interface circuit.

20. The method of claim 1, further comprising, prior to depositing the interposer electrodes, removing a portion of the interposer base.

* * * * *